US012604615B2

(12) United States Patent
Sung et al.

(10) Patent No.: US 12,604,615 B2
(45) Date of Patent: Apr. 14, 2026

(54) DISPLAY APPARATUS HAVING PROTRUDING CONDUCTIVE LAYER AND METHOD OF MANUFACTURING THE SAME

(71) Applicant: Samsung Display Co., Ltd., Yongin-si (KR)

(72) Inventors: Wooyong Sung, Yongin-si (KR); Taewook Kang, Yongin-si (KR); Jeongseok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 267 days.

(21) Appl. No.: 18/310,439

(22) Filed: May 1, 2023

(65) Prior Publication Data

US 2024/0090273 A1      Mar. 14, 2024

(30) Foreign Application Priority Data

Sep. 8, 2022    (KR) ........................ 10-2022-0114490

(51) Int. Cl.
| | |
|---|---|
| *H10K 59/122* | (2023.01) |
| *H10K 59/12* | (2023.01) |
| *H10K 59/131* | (2023.01) |
| *H10K 59/38* | (2023.01) |

(Continued)

(52) U.S. Cl.
CPC ....... *H10K 59/122* (2023.02); *H10K 59/1201* (2023.02); *H10K 59/131* (2023.02);
(Continued)

(58) Field of Classification Search
CPC ............... H10K 59/122; H10K 59/131; H10K 59/1315; H10K 59/1201; H10K 71/162; H10K 71/00
(Continued)

(56) References Cited

U.S. PATENT DOCUMENTS 8,487,301 B2    7/2013  Choi et al.
11,121,198 B2*  9/2021  Beak ................. H10K 59/1216
(Continued)

FOREIGN PATENT DOCUMENTS

CN        111312923 A      6/2020
KR    10-2008-0113782 A    12/2008
(Continued)

*Primary Examiner* — Nduka E Ojeh
(74) *Attorney, Agent, or Firm* — Womble Bond Dickinson (US) LLP

(57)                    ABSTRACT

A display apparatus includes: a substrate having a display area and a peripheral area extending around a periphery of the display area; a pixel electrode in the display area; a pixel-defining layer on the pixel electrode and having a first sub-opening exposing a central portion of the pixel electrode; a bank layer on the pixel-defining layer and having a second sub-opening exposing a central portion of the pixel electrode; a first conductive layer on the bank layer and having a tip protruding outwardly beyond the pixel electrode and the second sub-opening; an emission layer over the pixel electrode and the first conductive layer and having an opening exposing a portion of an upper surface of the first conductive layer; and an opposite electrode on the emission layer and in direct contact with the first conductive layer through the opening in the emission layer.

24 Claims, 25 Drawing Sheets

(51) Int. Cl.
    *H10K 59/80*         (2023.01)
    *H10K 71/16*         (2023.01)

(52) U.S. Cl.
    CPC ........... *H10K 59/38* (2023.02); *H10K 59/873*
        (2023.02); *H10K 59/879* (2023.02); *H10K*
        *59/8792* (2023.02); *H10K 71/162* (2023.02)

(58) Field of Classification Search
    USPC ......................................................... 257/40
    See application file for complete search history.

(56)                References Cited

U.S. PATENT DOCUMENTS

| | | | |
|---|---|---|---|
| 11,245,093 B2 | 2/2022 | Sung et al. | |
| 2013/0299791 A1* | 11/2013 | Hirakata | H10K 59/122 |
| | | | 257/43 |
| 2016/0043161 A1 | 2/2016 | Miyazawa | |
| 2021/0359078 A1 | 11/2021 | Kim et al. | |
| 2021/0408441 A1 | 12/2021 | Lee et al. | |
| 2022/0262876 A1 | 8/2022 | Lee | |
| 2023/0301139 A1* | 9/2023 | Choung | H10K 59/122 |
| | | | 257/40 |
| 2024/0138197 A1* | 4/2024 | Tabatake | H10K 59/873 |

FOREIGN PATENT DOCUMENTS

| | | |
|---|---|---|
| KR | 10-1193196 B1 | 10/2012 |
| KR | 10-2016-0053043 A | 5/2016 |
| KR | 10-2076620 B1 | 2/2020 |
| KR | 10-2083315 B1 | 3/2020 |
| KR | 10-2021-0138842 A | 11/2021 |
| WO | WO 2021/053792 A1 | 3/2021 |

* cited by examiner

1

DISPLAY APPARATUS HAVING PROTRUDING CONDUCTIVE LAYER AND METHOD OF MANUFACTURING THE SAME

CROSS-REFERENCE TO RELATED APPLICATIONS

This application claims priority to and the benefit of Korean Patent Application No. 10-2022-0114490, filed on Sep. 8, 2022, in the Korean Intellectual Property Office, the entire disclosure of which is incorporated herein by reference.

BACKGROUND

1. Field

Aspects of embodiments of the present disclosure relate to a display apparatus and a method of manufacturing the same.

2. Description of the Related Art

Recently, the use cases for display apparatuses have diversified. Also, as the thicknesses and weights of display apparatuses have decreased, the range of applications for display apparatuses has increased.

Generally, a display apparatus includes a plurality of pixels that receive electrical signals and emit light in response thereto to display an image. A pixel of an organic light-emitting diode display apparatus includes an organic light-emitting diode as a display element. The organic light-emitting diode includes a pixel electrode, an emission layer, and an opposite electrode.

Such a display apparatus may include an encapsulation layer, which seals the display element to prevent oxygen and/or moisture from the outside from penetrating into the display element.

SUMMARY

In a display apparatus and a method of manufacturing the same according to the related art, a dead space used to secure a bonding area of an encapsulation layer increases the non-display area of a display apparatus outside a display area thereof.

Embodiments of the present disclosure include a display apparatus in which a display area is expanded (or increased) by reducing a dead space area (e.g., by reducing an area of the dead space), and a method of manufacturing the same is also provided. However, the embodiments described herein are examples and do not limit the scope of the present disclosure.

Additional aspects and features of the present disclosure will be set forth, in part, in the description that follows and, in part, will be apparent from the description or may be learned by practice of the described embodiments.

According to an embodiment of the present disclosure, a display apparatus includes: a substrate having a display area and a peripheral area extending around a periphery of the display area; a pixel electrode in the display area; a pixel-defining layer on the pixel electrode and having a first sub-opening exposing a central portion of the pixel electrode; a bank layer on the pixel-defining layer and having a second sub-opening exposing a central portion of the pixel electrode; a first conductive layer on the bank layer and having a tip protruding outwardly beyond the pixel electrode and the second sub-opening; an emission layer over the pixel electrode and the first conductive layer and having an opening exposing a portion of an upper surface of the first conductive layer; and an opposite electrode on the emission layer and in direct contact with the first conductive layer through the opening in the emission layer.

The pixel-defining layer may include an inorganic insulating material, and the bank layer may include a metal material.

The display apparatus may further include a common voltage line in the peripheral area and configured to receive a common voltage, and the pixel-defining layer and the bank layer may extend to the peripheral area to cover the common voltage line. The pixel-defining layer may have an opening exposing a portion of an upper surface of the common voltage line, and the bank layer may be in direct contact with the common voltage line through the opening in the pixel-defining layer.

The display apparatus may further include a low reflection layer covering the first conductive layer, and the low reflection layer may include a metal oxide.

The first conductive layer may have an undercut structure.

The emission layer and the opposite electrode may be disconnected by the tip.

The display apparatus may further include an inorganic encapsulation layer on the opposite electrode, and the inorganic encapsulation layer may be in direct contact with a lower surface of the tip.

The display apparatus may further include: a light-shielding layer on the inorganic encapsulation layer and having a filter opening corresponding to the pixel electrode; and a color filter on the light-shielding layer and overlapping the pixel electrode.

The display apparatus may further include an organic planarization layer on the inorganic encapsulation layer, and a refractive index of the organic planarization layer may be greater than a refractive index of the inorganic encapsulation layer.

The refractive index of the organic planarization layer may be about 1.6 or more.

The opening in the emission layer may have a loop shape extending around at least a portion of a periphery of the second sub-opening.

The display apparatus may further include a first residual sacrificial layer between the pixel electrode and the pixel-defining layer, and the first residual sacrificial layer may overlap an edge of the pixel electrode.

The display apparatus may further include a second residual sacrificial layer between the bank layer and the first conductive layer, and the second residual sacrificial layer may be under the tip.

According to another embodiment of the present disclosure, a method of manufacturing a display apparatus is provided. The method includes: forming, on a substrate, a pixel electrode and a first sacrificial layer corresponding to the pixel electrode; forming a pixel-defining layer and a bank layer to cover the first sacrificial layer; forming, on the bank layer, a second sacrificial layer extending around a periphery of the pixel electrode; forming a first conductive layer to cover the bank layer and the second sacrificial layer; forming a first opening and a tip of the first conductive layer, the first opening exposing a central portion of the pixel electrode by penetrating through the pixel-defining layer, the bank layer, and the first conductive layer, the tip protruding outwardly beyond the pixel electrode; forming an emission layer having an opening exposing a portion of an upper surface of the first conductive layer; and forming an opposite electrode layer on the emission layer.

The emission layer may be formed on a front surface of the substrate.

The opening in the emission layer may be formed by a laser drilling process.

The opening in the emission layer may have a loop shape extending around at least a portion of a periphery of the first opening.

The first conductive layer may have an undercut structure, and the emission layer may be disconnected by the tip.

The opposite electrode layer may be in direct contact with the first conductive layer through the opening in the emission layer.

The method may further include forming an inorganic encapsulation layer on the opposite electrode layer.

The inorganic encapsulation layer may be formed to be in direct contact with a lower surface of the tip.

The method may further include: forming, on the inorganic encapsulation layer, a light-shielding layer having a filter opening corresponding to the pixel electrode; and forming, on the light-shielding layer, a color filter overlapping the pixel electrode.

The method may further include forming an organic planarization layer on the inorganic encapsulation layer, and a refractive index of the organic planarization layer may be greater than a refractive index of the inorganic encapsulation layer.

The forming of the first conductive layer may further include forming a low reflection layer on the first conductive layer.

Other aspects and features of the present disclosure, other than those described above, will become apparent from the following drawings, claims, and detailed description.

BRIEF DESCRIPTION OF THE DRAWINGS

The above and other aspects and features of embodiments of the present disclosure will be more apparent from the following description, taken in conjunction with the accompanying drawings, in which.

DETAILED DESCRIPTION

Figure 1:
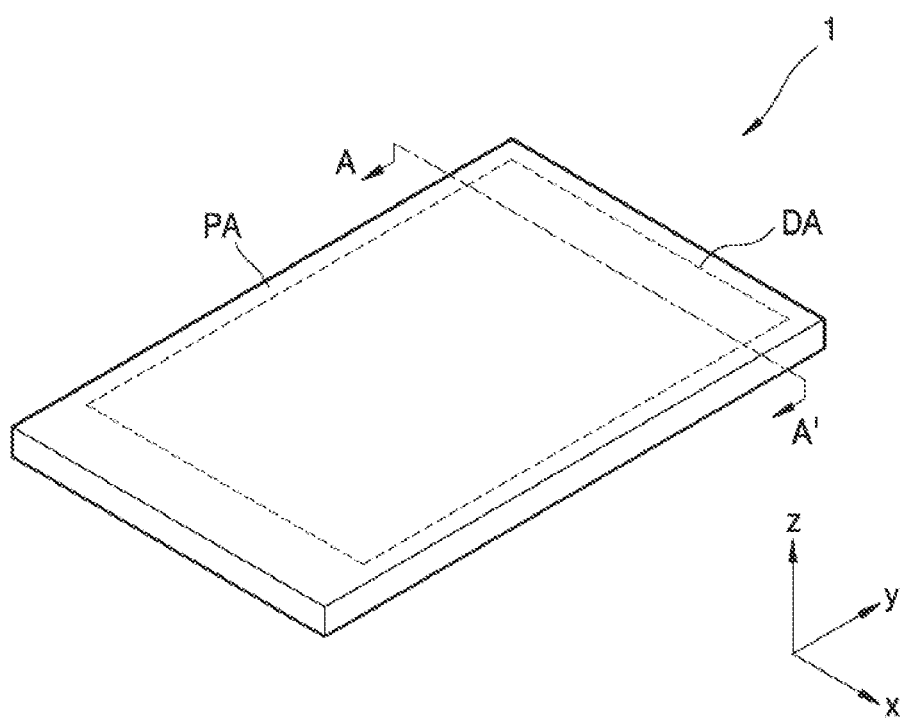
FIG. 1 is a schematic perspective view of a display apparatus according to an embodiment.

Reference will now be made in detail to embodiments, examples of which are illustrated in the accompanying drawings. The presented embodiments may have different forms and should not be construed as being limited to the descriptions set forth herein. Accordingly, embodiments are merely described below, by referring to the figures, to explain aspects and features of the present description.

Because various modifications may be applied and one or more embodiments may be implemented, certain embodiments will be shown in the drawings and described in detail in the detailed description. Aspects and features, and methods for achieving the same, will be clarified with reference to embodiments described below in detail with reference to the drawings. However, the embodiments may be implemented in various forms and are not limited to the embodiments presented below.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

As used herein, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Relative terms, such as "about" or "approximately," as used herein to refer to a certain numerical value may include numerical values in a generally accepted range in the art due to measurement limitations or errors. For example, the term "about" may include values in a range of +30%, +20%, +10%, or +5% of any numerical value.

When a certain embodiment may be implemented differently, a particular process order may be performed differently from the described order. As an example, two processes that are successively described may be performed substantially simultaneously (or concurrently) or may be performed in the order opposite to the described order.

The drivers, circuits, and/or any other relevant devices or components according to embodiments of the present disclosure described herein may be implemented utilizing any suitable hardware, firmware (e.g., an application-specific integrated circuit), software, and/or a suitable combination of software, firmware, and hardware. For example, the various components of the drivers and/or circuits may be formed on one integrated circuit (IC) chip or on separate IC chips. Further, the various components of the drivers and/or circuits may be implemented on a flexible printed circuit film, a tape carrier package (TCP), a printed circuit board (PCB), or formed on a same substrate as the drivers and/or circuits. Further, the various components of the drivers and/or circuits may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present disclosure.

FIG. 1 is a schematic perspective view of a display apparatus 1 according to an embodiment.

Referring to FIG. 1, the display apparatus 1 has a display area DA and a peripheral area PA surrounding (e.g., surrounding in a plan view or extending around a periphery of) the display area DA. The display apparatus 1 may display an image by using light emitted from a plurality of pixels arranged in the display area DA.

The peripheral area PA may entirely surround the display area DA. The peripheral area PA is non-display area in which pixels are not arranged, and drivers or wires for providing electrical signals or power to the pixels may be arranged in the peripheral area PA.

The display apparatus 1 may have a rectangular shape in which a horizontal length is greater than a vertical length as in the embodiment shown in FIG. 1, but the present disclosure is not limited thereto. The display apparatus 1 may have various shapes, such as a polygonal, circular, or elliptical shape.

Hereinafter, an organic light-emitting display apparatus is described as an example of the display apparatus 1 according to an embodiment, but the display apparatus according to one or more embodiments is not limited thereto. In another embodiment, another type of display apparatus, such as a quantum dot light-emitting display, may be used.

Figure 2:
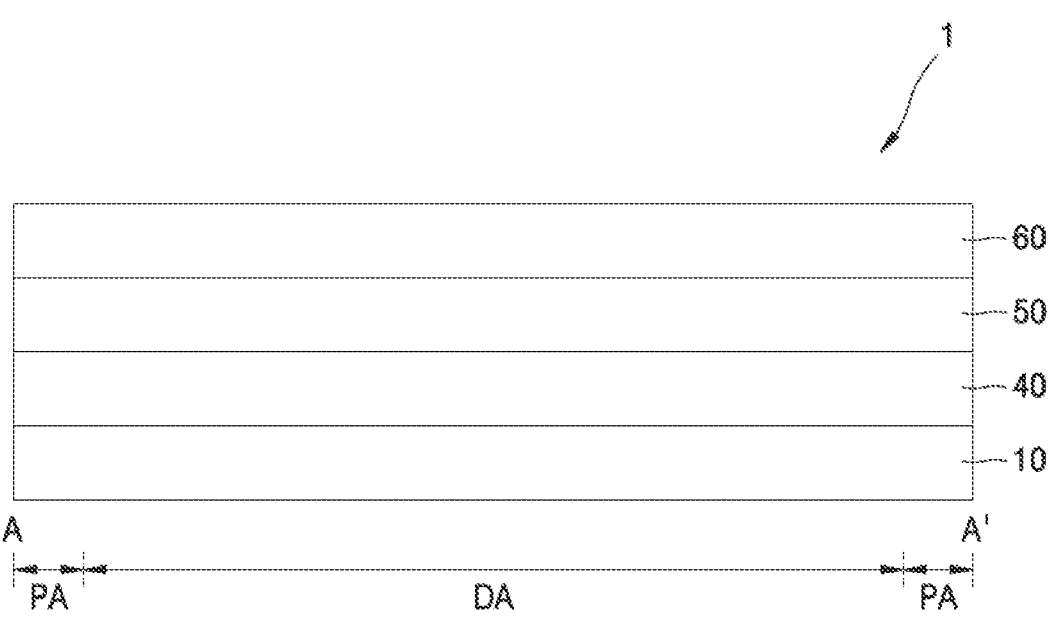
FIG. 2 is a schematic cross-sectional view of the display apparatus shown in FIG. 1 taken along the line A-A'.
Figure 2:
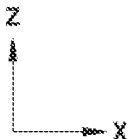

FIG. 2 is a schematic cross-sectional view of the display apparatus 1 shown in FIG. 1 taken along the line A-A'.

Referring to FIG. 2, the display apparatus 1 may include a display panel 10, an input sensing layer 40 disposed on the display panel 10, and an optical functional layer 50, and these layers (or elements) may be covered by a window 60. The display apparatus 1 may include (or may be included in) various types of electronic devices, such as mobile phones, laptop computers, and smartwatches.

The display panel 10 may display an image. The display panel 10 may include pixels arranged in the display area DA. Each of the pixels may include a display element and a pixel circuit connected to the display element. The display element may include an organic light-emitting diode or a quantum dot organic light-emitting diode.

The input sensing layer 40 may obtain coordinate information according to an external input (e.g., a touch event). The input sensing layer 40 may include a sensing electrode (or a touch electrode) and trace lines connected to the sensing electrode. The input sensing layer 40 may be disposed on the display panel 10. The input sensing layer 40 may sense an external input by using a mutual capacitance method and/or a self-capacitance method.

The input sensing layer 40 may be directly formed on the display panel 10 or may be separately formed and then combined with the display panel 10 by using an adhesive layer, such as an optical clear adhesive. For example, the input sensing layer 40 may be continuously formed after a process of forming the display panel 10, and in such an embodiment, the input sensing layer 40 may be understood as being a portion (or a layer) of the display panel 10, and an adhesive layer between the input sensing layer 40 and the display panel 10 may be omitted. Although FIG. 2 illustrates an embodiment in which the input sensing layer 40 is between the display panel 10 and the optical functional layer 50, in another embodiment, the input sensing layer 40 may be arranged over (or on) the optical functional layer 50.

The optical functional layer 50 may include an anti-reflection layer. The anti-reflection layer may reduce a reflectance of light (e.g., external light) incident from the outside toward the display panel 10 through the window 60. In an embodiment, the anti-reflection layer may include a black matrix and color filters. The color filters may be arranged according to color(s) of light respectively emitted from the pixels of the display panel 10.

In another embodiment, the anti-reflection layer may include a retarder and a polarizer. The retarder may include a film-type retarder or a liquid crystal-type retarder and may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals (e.g., may include liquid crystals arranged in a certain arrangement). Each of the retarder and the polarizer may further include a protective film. The retarder and the polarizer themselves or the protective films thereof may be defined as a base layer of the anti-reflection layer.

In another embodiment, the anti-reflection layer may include a destructive interference structure. The destructive interference structure may include a first reflection layer and a second reflection layer arranged on different layers. First reflected light and second reflected light respectively reflected by the first reflection layer and the second reflection layer may destructively interfere with each other, and thus, reflectance of external light may be reduced.

In an embodiment, the optical functional layer 50 may be continuously formed after a process of forming the display panel 10 and/or the input sensing layer 40. In such an embodiment, an adhesive layer between the optical functional layer 50 and the display panel 10 and/or between the display panel 10 and the input sensing layer 40 may be omitted.

A layer including an optical clear adhesive or an optical clear resin may be between the window 60 and the optical functional layer 50.

Figure 3:
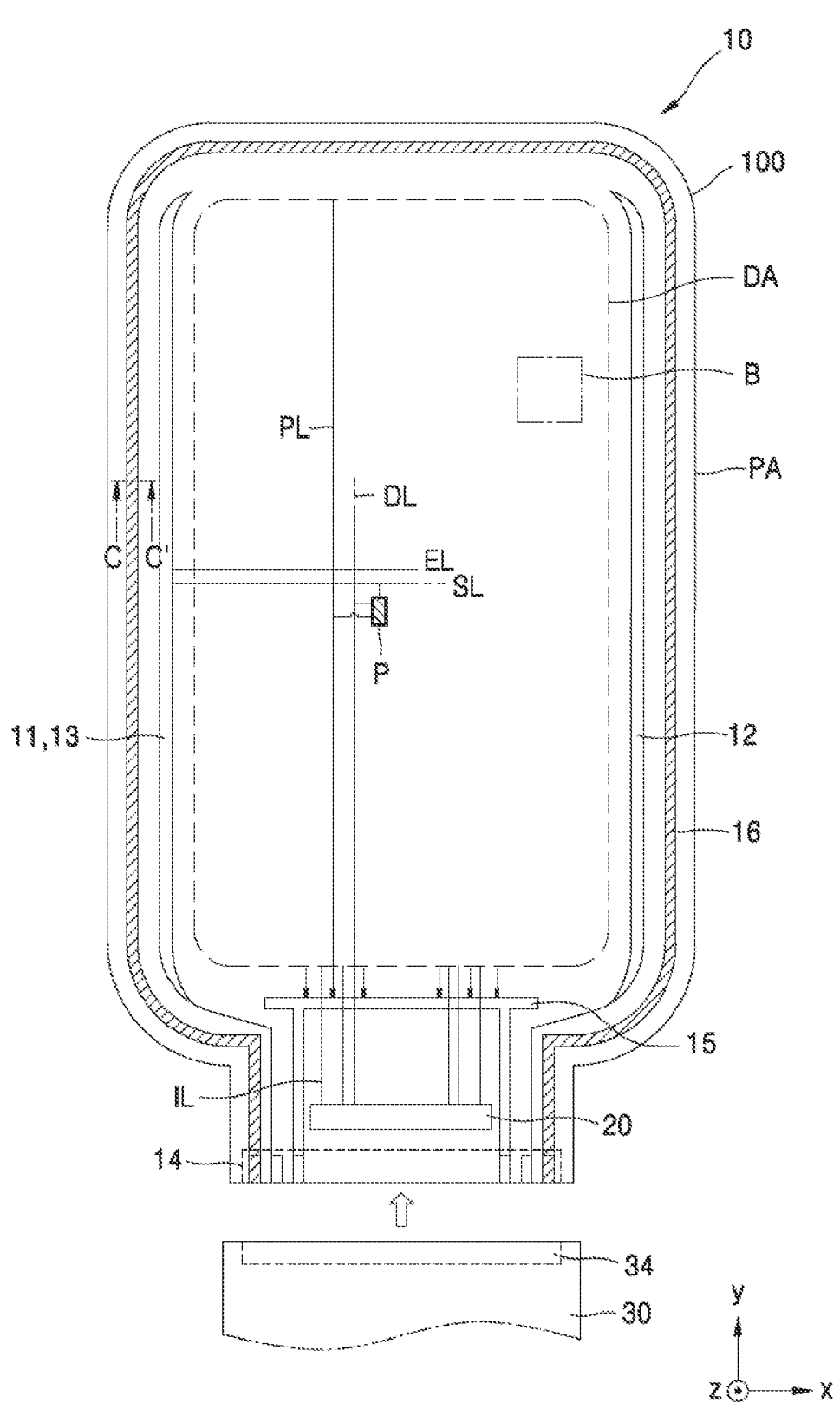
FIG. 3 is a schematic plan view of a display panel according to an embodiment.

FIG. 3 is a schematic plan view of the display panel 10 according to an embodiment. As described above with reference to FIG. 2, the display apparatus according to an embodiment may include the display panel 10. It may be understood that FIG. 3 illustrates a substrate 100 of the display panel 10.

Referring to FIG. 3, the display panel 10 has the display area DA and the peripheral area PA outside the display area DA. The display area DA may be an area at where an image is displayed, and a plurality of pixels P may be arranged in the display area DA. For example, the display area DA may have various shapes, such as a circular shape, an elliptical shape, a polygonal shape, or a particular figure shape. FIG. 3 illustrates an embodiment in which the display area DA has substantially rectangle shape with rounded edges.

Each pixel P refers to a sub-pixel and may include a display element, such as an organic light-emitting diode. Each pixel P may emit, for example, red, green, blue, or white light.

The peripheral area PA may be arranged outside the display area DA. External circuits for driving the pixels P may be arranged in the peripheral area PA. A first scan driving circuit 11, a second scan driving circuit 12, an emission control driving circuit 13, a terminal 14, a driving power supply wire 15, and a common power supply wire 16 (also referred to as common voltage line) may be arranged in the peripheral area PA.

The first scan driving circuit 11 may provide a scan signal to the pixels P via a scan line SL. The second scan driving circuit 12 may be arranged parallel to the first scan driving circuit 11 with the display area DA therebetween. Some of the pixels P arranged in the display area DA may be electrically connected to the first scan driving circuit 11 and others may be electrically connected to the second scan driving circuit 12. The second scan driving circuit 12 may be omitted in some embodiments, in which case all of the pixels P arranged in the display area DA may be electrically connected to the first scan driving circuit 11.

The emission control driving circuit 13 is arranged close to the first scan driving circuit 11 and may provide an emission control signal to the pixels P via an emission control line EL. FIG. 3 illustrates an embodiment in which the emission control driving circuit 13 is arranged on only one side of the display area DA, but the emission control driving circuit 13 may be arranged on opposite sides of the display area DA, similar to the first and second scan driving circuits 11 and 12.

In an embodiment, the peripheral area PA may include a bending area extending toward one side (e.g., in a −y direction) of the display area DA. The bending area is bent toward the rear surface of the display area DA and may reduce an area of a non-display area visible when viewed from the front surface of the display apparatus.

A driving chip 20 may be arranged in the peripheral area PA. The driving chip 20 may include an integrated circuit for driving the display panel 10. Such the integrated circuit may be a data driving integrated circuit for generating a data signal, but one or more embodiments are not limited thereto.

The terminal 14 may be arranged in the peripheral area PA. The terminal 14 may not be covered by an insulating layer to be exposed therethrough and may be electrically connected to a printed circuit board 30. A terminal 34 of the printed circuit board 30 may be electrically connected to the terminal 14 of the display panel 10.

The printed circuit board 30 may transmit, to the display panel 10, a signal or power for a controller. Control signals generated by the controller may be respectively transmitted to driving circuits through the printed circuit board 30. Also, the controller may transmit a driving voltage ELVDD (see FIG. 4) to the driving power supply wire 15 and provide a common voltage ELVSS (see FIG. 4) to the common power supply wire 16. The driving voltage ELVDD may be transmitted to each pixel P through a driving voltage line PL connected to the driving power supply wire 15, and the common voltage ELVSS may be transmitted to an opposite electrode of a pixel P connected to the common power supply wire 16. The driving power supply wire 15 may have a shape extending in a direction (e.g., an x-axis direction) from under (or below) the display area DA. The common power supply wire 16 has a loop shape having an open side and may have a shape at least partially surrounding the display area DA.

In addition, the controller generates a data signal, and the data signal is transmitted to an input line IL via the driving chip 20 and may be transmitted to the pixels P via a data line DL connected to the input line IL. For reference, the term "line" as used herein may denote a "wire."

Figure 4:
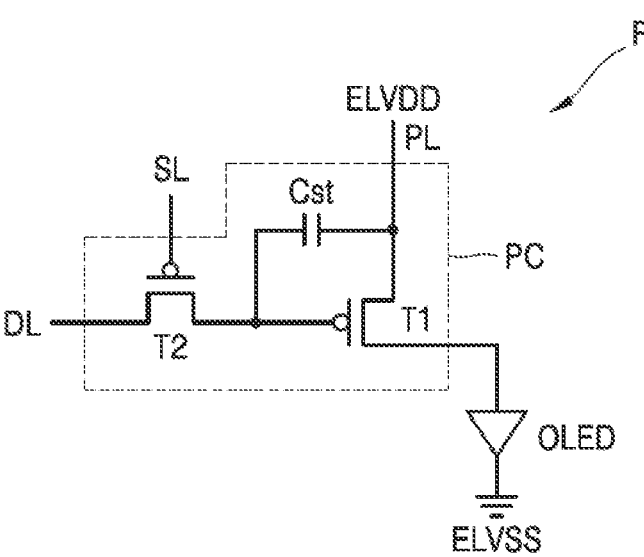
FIG. 4 is an equivalent circuit diagram of a pixel included in a display apparatus according to an embodiment.

FIG. 4 is an equivalent circuit diagram of a pixel P included in the display apparatus according to an embodiment.

Referring to FIG. 4, one pixel P may include a pixel circuit PC and an organic light-emitting diode OLED, which is a display element connected to the pixel circuit PC. The pixel circuit PC may include a first thin-film transistor T1, a second thin-film transistor T2, and a storage capacitor Cst. Each pixel P may emit, for example, red, green, or blue light or may emit red, green, blue, or white light through the organic light-emitting diode OLED.

The second thin-film transistor T2, as a switching thin-film transistor, may be connected to a scan line SL and a data line DL and may be configured to transmit a data voltage input from the data line DL to the first thin-film transistor T1 based on a switching voltage input from the scan line SL. The storage capacitor Cst may be connected to the second thin-film transistor T2 and the driving voltage line PL and may be configured to store a voltage corresponding to the difference between a voltage received from the second thin-film transistor T2 and the driving voltage ELVDD supplied to the driving voltage line PL.

The first thin-film transistor T1, as a driving thin-film transistor, may be connected to the driving voltage line PL and the storage capacitor Cst and may be configured to control a driving current flowing from the driving voltage line PL through the organic light-emitting diode OLED in response to a voltage value stored in the storage capacitor Cst. The organic light-emitting diode OLED may emit light having a luminance according to the driving current. The opposite electrode (e.g., a cathode) of the organic light-emitting diode OLED may be configured to receive the common voltage ELVSS.

Although FIG. 4 illustrates an embodiment in which the pixel circuit PC includes two thin-film transistors and one storage capacitor, one or more embodiments are not limited thereto. The number of thin-film transistors and the number of storage capacitors may be variously changed according to the design of the pixel circuit PC. For example, the pixel circuit PC may further include three or more thin-film transistors in addition to the two thin-film transistors described above.

Figure 5:
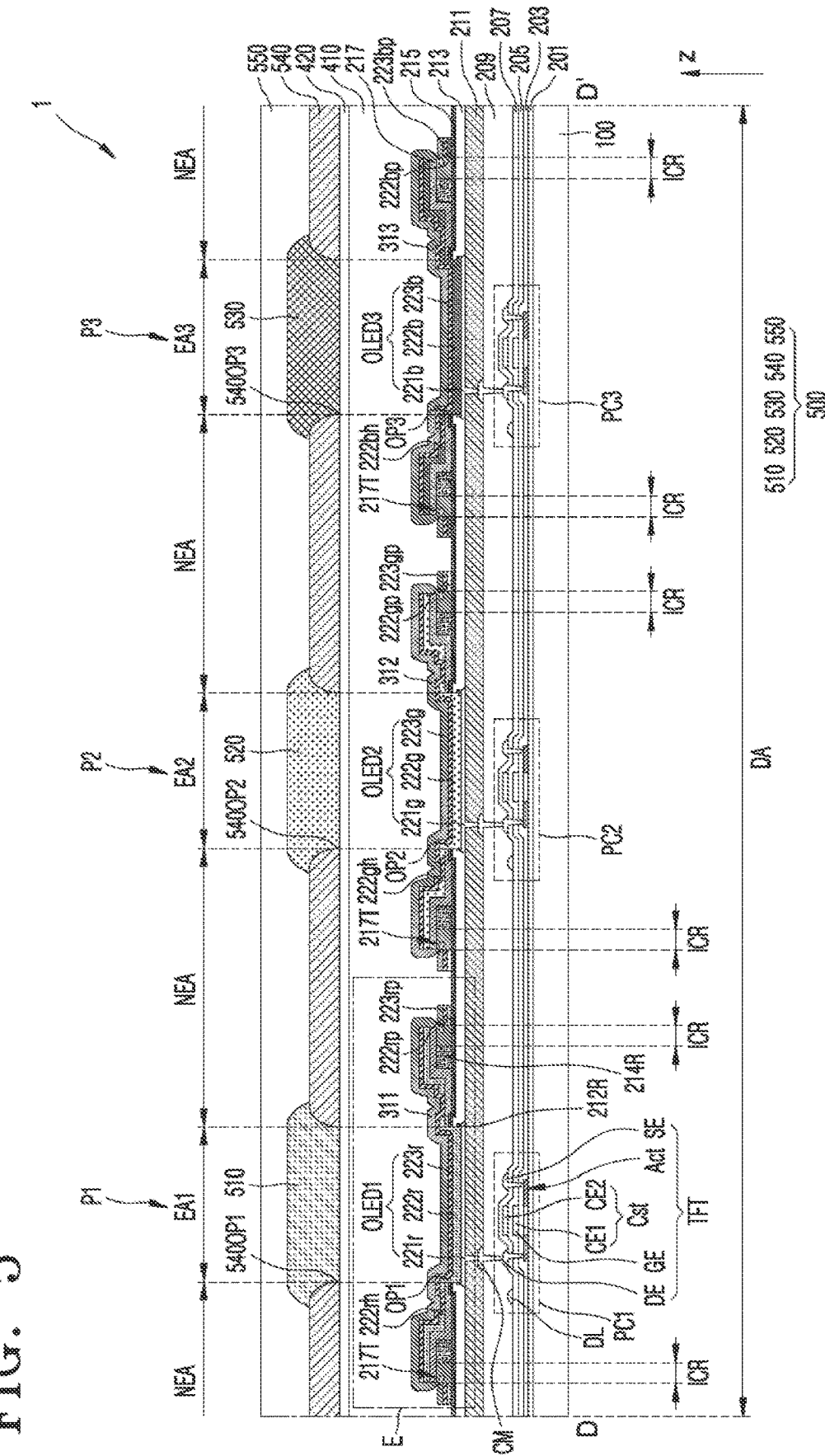
FIG. 5 is a schematic cross-sectional view of a display apparatus according to an embodiment.
Figure 6:
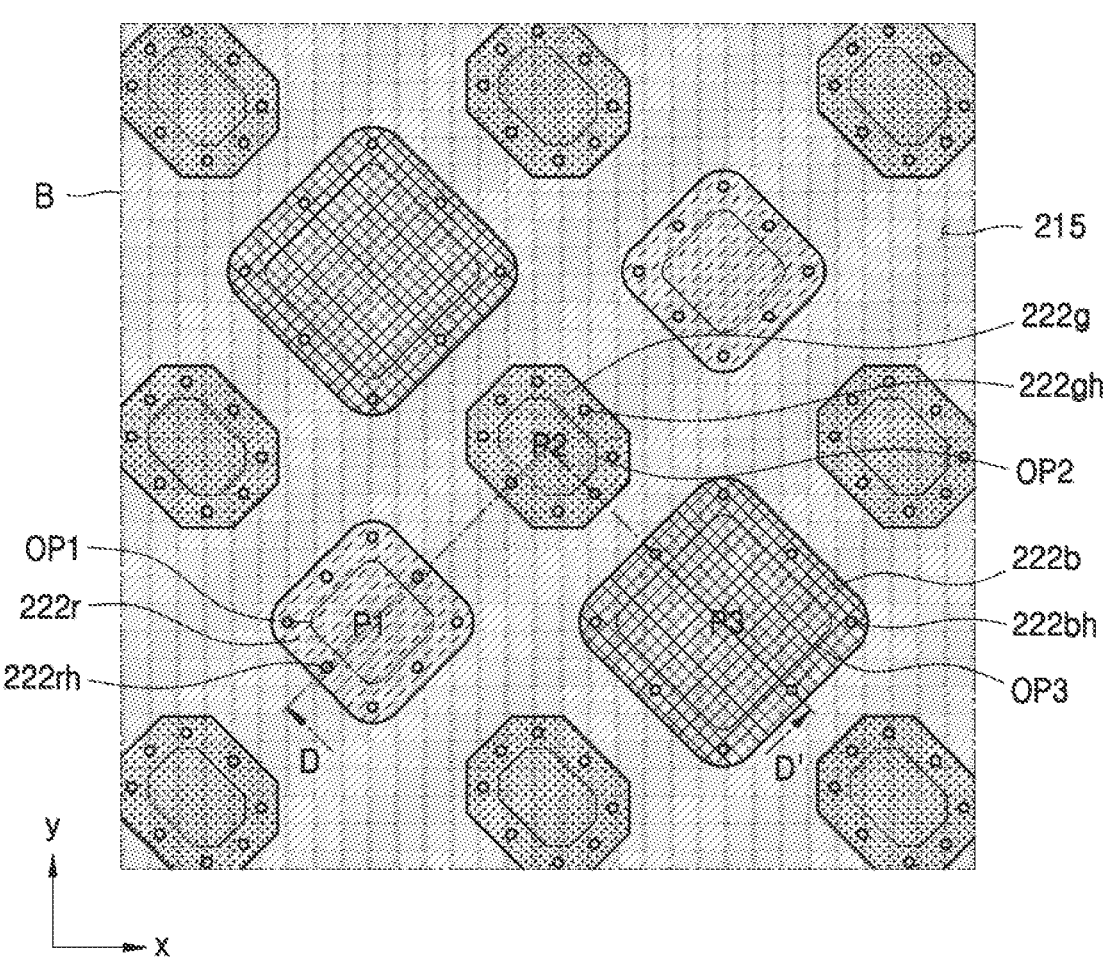
FIGS. 6 and 7 are schematic plan views of a display apparatus according to embodiments.
Figure 7:
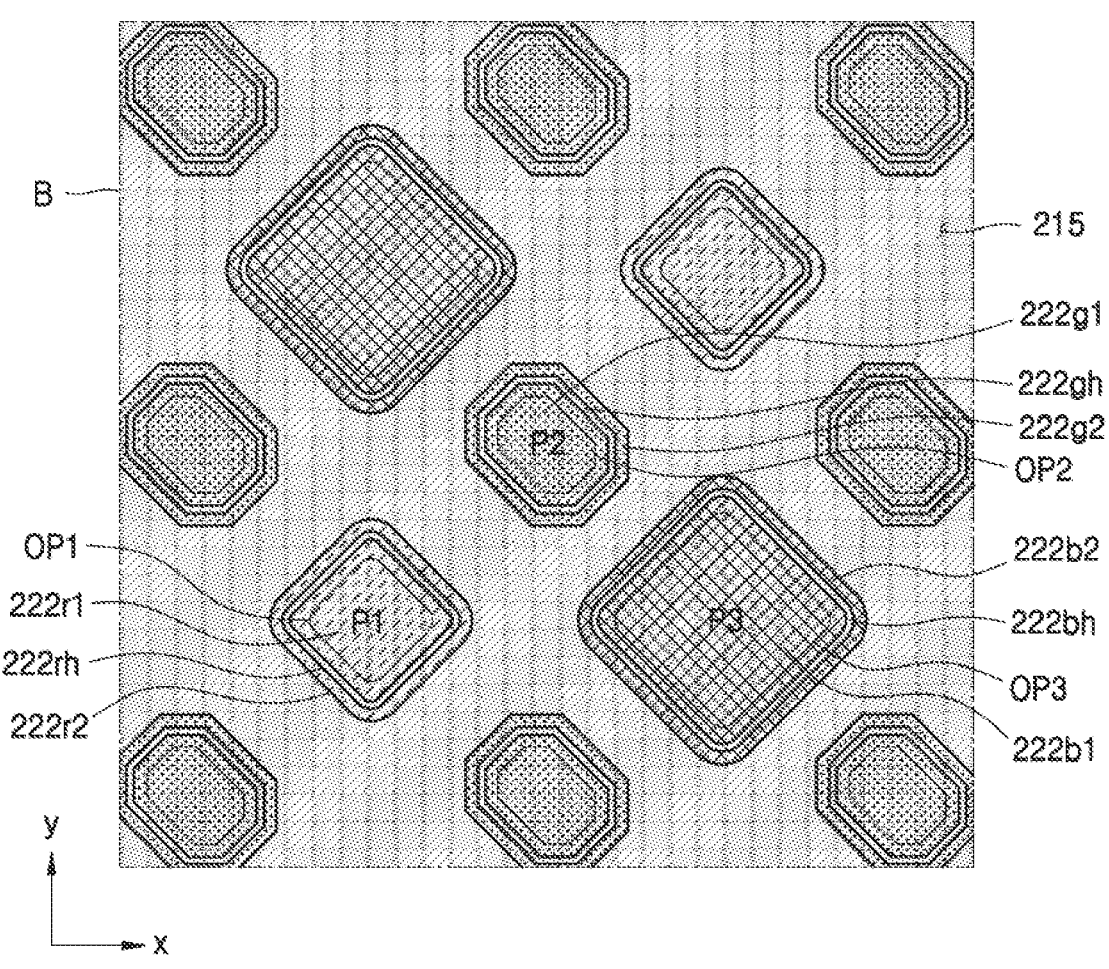
Figure 8:
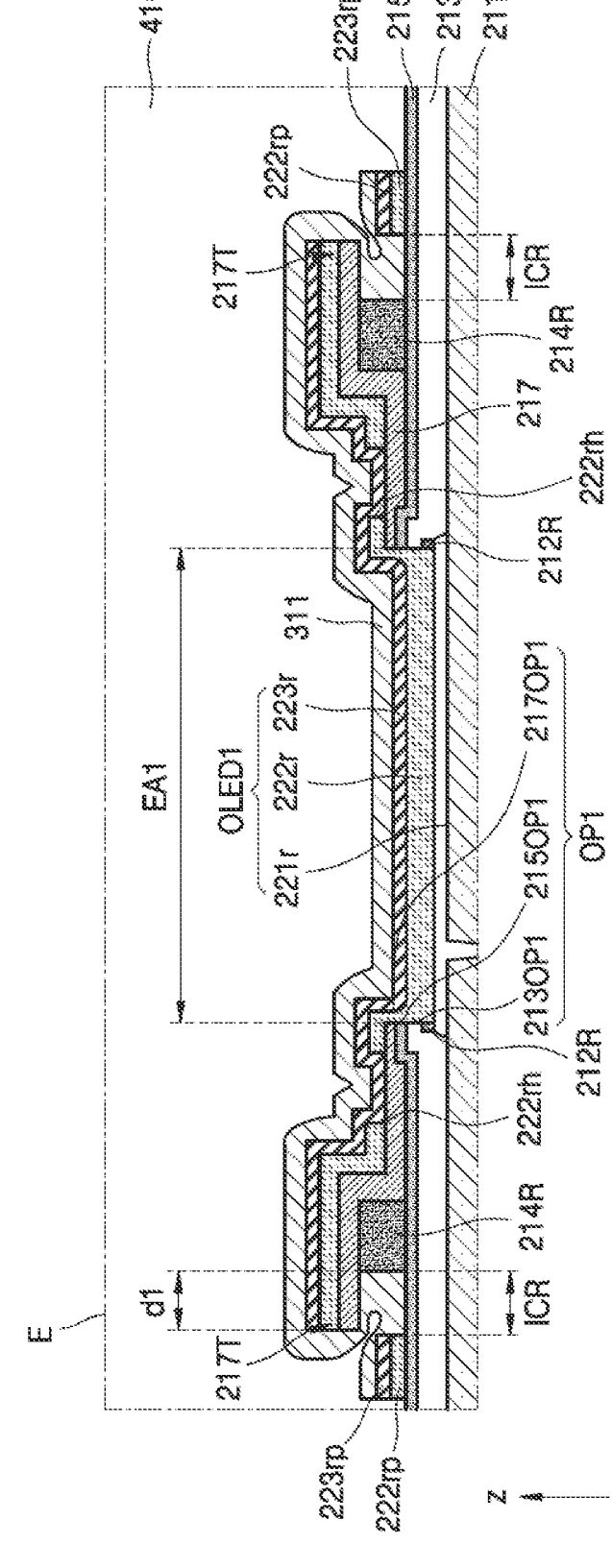
FIG. 8 is an enlarged cross-sectional view of the area E of the display apparatus shown in FIG. 5.

FIG. 5 is a schematic cross-sectional view of the display apparatus 1 according to an embodiment, FIGS. 6 and 7 are schematic cross-sectional views of the display apparatus according to embodiments, and FIG. 8 is an enlarged cross-sectional view of the area E of the display apparatus shown in FIG. 5. FIG. 5 may correspond to a cross-section of the display apparatus illustrated in FIG. 6 taken along the line D-D'. Also, FIG. 5 primarily describes the display panel 10 and the optical functional layer 50, such that some elements may be omitted for ease of understanding.

Referring to FIGS. 5 to 8, the display panel 10 may include the substrate 100.

The substrate 100 may include a glass material or a polymer resin. In an embodiment, the substrate 100 may have a multi-layered structure in which a base layer including a polymer resin and a barrier layer that prevents penetration of external foreign substances are alternately stacked.

The base layer may include a polymer resin, such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), and cellulose acetate propionate (CAP).

The barrier layer may include an inorganic material, such as silicon nitride ($SiN_x$) or silicon oxide ($SiO_x$).

A first pixel P1 that emits light in a first color, a second pixel P2 that emits light in a second color, and a third pixel P3 that emits light in a third color may be arranged in the display area DA of the substrate 100. Each of the first, second, and third colors may be any one (e.g., may emit light of any one) of red, blue, green, and white.

The first pixel P1 may include a first pixel circuit PC1 and a first organic light-emitting diode OLED1, which is a display element electrically connected to the first pixel circuit PC1. The second pixel P2 may include a second pixel circuit PC2 and a second organic light-emitting diode OLED2 electrically connected to the second pixel circuit PC2. The third pixel P3 may include a third pixel circuit PC3 and a third organic light-emitting diode OLED3 electrically connected to the third pixel circuit PC3.

A buffer layer 201 may be disposed on the substrate 100 to prevent impurities from penetrating into a semiconductor layer Act of the thin-film transistor TFT of the first pixel circuit PC1. The buffer layer 201 may include an inorganic insulating material, such as $SiN_x$, silicon oxynitride (SiON), and $SiO_x$, and may be a single layer or a multi-layer structure, each including the above inorganic insulating material.

The first pixel circuit PC1, the second pixel circuit PC2, and the third pixel circuit PC3 may be disposed on the buffer layer 201. The first pixel circuit PC1 may include a thin-film transistor TFT and a storage capacitor Cst. The thin-film transistor TFT may include the semiconductor layer Act, a gate electrode GE, a source electrode SE, and a drain electrode DE. The thin-film transistor TFT illustrated in FIG. 5 may correspond to the first thin-film transistor T1 described above with reference to FIG. 4. Although the data line DL is not illustrated in FIG. 5, the data line DL is electrically connected to the second thin-film transistor T2 included in the first pixel circuit PC1. In the illustrated embodiment, a top gate-type transistor in which a gate electrode GE is arranged over the semiconductor layer Act with a gate insulating layer 203 therebetween is illustrated; however, according to another embodiment, the thin-film transistor TFT may be a bottom gate-type transistor. The second pixel circuit PC2 and the third pixel circuit PC3 may have the same or similar structure as the first pixel circuit PC1. Hereinafter, elements of the first pixel circuit PC1 are primarily described.

The semiconductor layer Act may include polysilicon. In other embodiments, the semiconductor layer Act may include amorphous silicon, an oxide semiconductor, an organic semiconductor, or the like. The gate electrode GE may include a low-resistance metal material. The gate electrode GE may include a conductive material including molybdenum (Mo), aluminum (Al), copper (Cu), titanium (Ti), or the like and may include a single layer or a multi-layer structure, each including the above material.

The gate insulating layer 203 between the semiconductor layer Act and the gate electrode GE may include an inorganic insulating material, such as $SiO_x$, $SiN_x$, SiON, aluminum oxide ($Al_2O_3$), titanium oxide ($TiO_x$), tantalum oxide ($Ta_2O_5$), and hafnium oxide ($HfO_2$). The gate insulating layer 203 may include a single layer or a multi-layer structure, each including the above material.

The storage capacitor Cst may include a lower electrode CE1 and an upper electrode CE2, which overlap each other with a first interlayer insulating layer 205 therebetween. The storage capacitor Cst may overlap the thin-film transistor TFT. In the embodiment illustrated in FIG. 5, the gate electrode GE of the thin-film transistor TFT is the lower electrode CE1 of the storage capacitor Cst. In another embodiment, the storage capacitor Cst may not overlap the thin-film transistor TFT. The storage capacitor Cst may be covered by a second interlayer insulating layer 207. The upper electrode CE2 of the storage capacitor Cst may include a conductive material including Mo, Al, Cu, Ti, or the like and may include a single layer or a multi-layer structure, each including the above material.

Each of the first interlayer insulating layer 205 and the second interlayer insulating layer 207 may include an inorganic insulating material, such as $SiO_x$, $SiN_x$, SiON, $Al_2O_3$, $TiO_x$, $Ta_2O_5$, and $HfO_2$. Each of the first interlayer insulating layer 205 and the second interlayer insulating layer 207 may include a single layer or a multi-layer structure, each including the above material.

The source electrode SE and the drain electrode DE may be positioned over the same layer and may include the same material as the data line DL. For example, the source electrode SE, the drain electrode DE, and the data line DL may be disposed on the second interlayer insulating layer 207. Each of the source electrode SE, the drain electrode DE, and the data line DL may include a material having high conductivity. Each of the source electrode SE and the drain electrode DE may include a conductive material including Mo, Al, Cu, Ti, or the like and may include a single layer or a multi-layer structure, each including the above material. In an embodiment, each of the source electrode SE, the drain electrode DE, and the data line DL may include a multi-layer structure of Ti/Al/Ti.

The first pixel circuit PC1, the second pixel circuit PC2, and the third pixel circuit PC3, each including the thin-film transistor TFT and the storage capacitor Cst, may be covered by a first organic insulating layer 209. The first organic insulating layer 209 may include a substantially flat (or planar) upper surface.

The first organic light-emitting diode OLED1 electrically connected to the first pixel circuit PC1, the second organic light-emitting diode OLED2 electrically connected to the second pixel circuit PC2, and the third organic light-emitting diode OLED3 electrically connected to the third pixel circuit PC3 may be positioned over the first organic insulating layer 209.

The first pixel circuit PC1 may be electrically connected to a first pixel electrode 221r of the first organic light-emitting diode OLED1. For example, as shown in FIG. 5, a contact metal layer CM may be between the thin-film transistor TFT and the first pixel electrode 221r. The contact metal layer CM may be connected to the thin-film transistor TFT through a contact hole (e.g., a contact opening) penetrating the first organic insulating layer 209, and the first pixel electrode 221r may be connected to the contact metal layer CM through a contact hole (e.g., a contact opening) penetrating a second organic insulating layer 211 on (or over) the contact metal layer CM. The contact metal layer CM may include a conductive material including Mo, Al, Cu, Ti, or the like and may include a single layer or a multi-layer structure, each including the above material. In an embodiment, the contact metal layer CM may include a multi-layer structure of Ti/Al/Ti.

Each of the first organic insulating layer 209 and the second organic insulating layer 211 may include an organic insulating material, such as a general-purpose polymer such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any blend thereof. In an embodiment, each of the first organic insulating layer 209 and the second organic insulating layer 211 may include PI.

According to another embodiment, one of the first organic insulating layer 209 and the second organic insulating layer 211 may be omitted. In such an embodiment, the contact metal layer CM may also be omitted.

The first organic light-emitting diode OLED1 may include the first pixel electrode 221r, a first emission layer 222r, and a first opposite electrode 223r. The second organic light-emitting diode OLED2 may include a second pixel electrode 221g, a second emission layer 222g, and a second opposite electrode 223g. The third organic light-emitting diode OLED3 may include a third pixel electrode 221b, a third emission layer 222b, and a third opposite electrode 223b. The second organic light-emitting diode OLED2 and the third organic light-emitting diode OLED3 may have a structure similar to or the same as that of the first organic light-emitting diode OLED1. Hereinafter, the structure of the first organic light-emitting diode OLED1 is primarily described in detail with reference to FIG. 8.

The first pixel electrode 221r may be disposed on the second organic insulating layer 211. The first pixel electrode 221r may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first pixel electrode 221r may include a reflection layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the first pixel electrode 221r may further include a layer including ITO, IZO, ZnO, or $In_2O_3$ over and/or under the reflection layer, described above.

A pixel-defining layer 213 and a bank layer 215 may be positioned over the first pixel electrode 221r. The pixel-defining layer 213 may have a first sub-opening 213OP1 that exposes a central portion of the first pixel electrode 221r, and when viewed in a direction (e.g., a z-axis direction) substantially perpendicular to (or normal to) the substrate 100, the pixel-defining layer 213 may overlap the edge of the first pixel electrode 221r. The pixel-defining layer 213 may include an inorganic insulating material, such as $SiN_x$, $SiO_x$, or silicon oxynitride ($SiO_xN_y$).

A first residual sacrificial layer 212R may be between the first pixel electrode 221r and the pixel-defining layer 213. The first residual sacrificial layer 212R may be a portion remaining after a sacrificial layer that protects the upper surface of the first pixel electrode 221r is removed. The first residual sacrificial layer 212R may be in an area in which the pixel-defining layer 213 and the first pixel electrode 221r overlap each other when viewed in the direction (e.g., the z-axis direction) substantially perpendicular to the substrate 100. For example, the first residual sacrificial layer 212R may be positioned along the edge of the first pixel electrode 221r to expose the central portion of the first pixel electrode 221r.

The first residual sacrificial layer 212R may be continuously formed with the first pixel electrode 221r and may include a material that may be selectively etched without damaging the first pixel electrode 221r. For example, the first residual sacrificial layer 212R may include indium gallium zinc oxide (IGZO) and/or indium zinc oxide (IZO).

The first residual sacrificial layer 212R and the pixel-defining layer 213 overlap the edge of the first pixel electrode 221r and increase a distance between the first pixel electrode 221r and the first opposite electrode 223r, such that an arc or the like may not occur therebetween. In some embodiments, the sacrificial layer may be completely removed, and thus, the first residual sacrificial layer 212R may not be present. In such an embodiments, a groove formed by the removal of a sacrificial layer between the first pixel electrode 221r and the pixel-defining layer 213 may be empty or may be filled with the first emission layer 222r, to be described below.

The bank layer 215 may be disposed on the pixel-defining layer 213. The bank layer 215 may have a second sub-opening 215OP1 that exposes the central portion of the first pixel electrode 221r. The second sub-opening 215OP1 in the bank layer 215 may overlap the first sub-opening 213OP1 in the pixel-defining layer 213.

The bank layer 215 may include a conductive material. For example, the bank layer 215 may include a conductive material including Mo, Al, Cu, Ti, or the like and may include a single layer or a multi-layer structure, each including the above material. For example, the bank layer 215 may have a double-layered structure of Al/Ti or a triple-layered structure of Ti/Al/Ti.

The pixel-defining layer 213 and the bank layer 215 may extend from the display area DA to the peripheral area PA (see, e.g., FIG. 3) of the substrate 100, and the bank layer 215 may be in direct contact with the common power supply wire 16 positioned in the peripheral area PA (see, e.g., FIG. 3) through an opening in the pixel-defining layer 213. Accordingly, the bank layer 215 may act as a connection electrode or auxiliary wire to transmit the common voltage ELVSS to the first opposite electrode 223r, the second opposite electrode 223g, and the third opposite electrode 223b, which are described below.

A first conductive layer 217 may be positioned over the bank layer 215. The first conductive layer 217 may have a third sub-opening 217OP1 that exposes the central portion of the first pixel electrode 221r, and a tip 217T protruding outwardly (e.g., protruding outwardly along the substrate 100 away) from the center of the first pixel electrode 221r. When viewed in the direction (e.g., the z-axis direction) perpendicular to the upper surface of the substrate 100, the tip 217T of the first conductive layer 217 may have a loop shape entirely surrounding the first pixel electrode 221r.

The third sub-opening 217OP1 may overlap the first sub-opening 213OP1 and the second sub-opening 215OP1 to constitute the first opening OP1. That is, the first opening OP1 may penetrate the pixel-defining layer 213, the bank layer 215, and the first conductive layer 217 to expose a central portion of the upper surface of the first pixel electrode 221r, and the first emission layer 222r, to be described below, may overlap and be in contact with the first pixel electrode 221r through (or in) the first opening OP1. Accordingly, the first opening OP1 may define a first emission area EA1. The outside of the first emission area EA1 may be defined as a non-emission area NEA. In an embodiment, diameters of the first sub-opening 213OP1, the second sub-opening 215OP1, and the third sub-opening 217OP1 may be substantially the same as or similar to each other.

A portion of the first conductive layer 217 may be spaced apart from the bank layer 215 in the direction (e.g., the z-axis direction) perpendicular to the substrate 100 and may constitute the tip 217T protruding outwardly from the center of the first pixel electrode 221r. Because the tip 217T of the first conductive layer 217 is formed by the removal of some of a sacrificial layer between the first conductive layer 217 and the bank layer 215, the first conductive layer 217 may have an undercut structure. Accordingly, the tip 217T of the first conductive layer 217 may have an eave structure with a lower surface thereof being exposed. A protruding length d1 of the tip 217T of the first conductive layer 217 may be about 0.5 μm or more. In some embodiments, the protruding length d1 of the tip 217T of the first conductive layer 217 may be about 0.3 μm to about 1 μm or about 0.3 μm to about 0.7 μm.

The first conductive layer 217 may include a conductive material. For example, the first conductive layer 217 may include a conductive material including Mo, Al, Cu, Ti, or the like and may include a single layer or a multi-layer structure, each including the above material. For example, the first conductive layer 217 may have a double-layered structure of Al/Ti or a triple-layered structure of Ti/Al/Ti.

In an embodiment, a low reflection layer may be positioned over the first conductive layer 217. The low reflection layer may be a layer having a surface reflectance lower than that of the first conductive layer 217. The low reflection layer may prevent light (e.g., external light) incident toward the display apparatus 1 from being reflected by the surface of the first conductive layer 217 and from being recognized by a user of the display apparatus 1.

In an embodiment, the low reflection layer may include a low reflection material. The low reflection material may include a metal oxide having a high absorbance (e.g., a high extinction coefficient (k)). For example, the low reflection layer may include at least one of copper oxide (CuO), calcium oxide (CaO), molybdenum oxide ($MoO_x$), and zinc oxide (ZnO). In some embodiments, the low reflection layer may include a material in which CuO and CaO are mixed.

A second residual sacrificial layer 214R may be between the bank layer 215 and the first conductive layer 217. The second residual sacrificial layer 214R may be a remaining portion of a sacrificial layer that is removed to form the tip 217T of the first conductive layer 217. When viewed in the direction (e.g., z-axis direction) substantially perpendicular to the substrate 100, the second residual sacrificial layer 214R may be spaced apart from the first pixel electrode 221r by a certain distance and may have a loop shape entirely surrounding the first pixel electrode 221r. The first conductive layer 217 may have an undercut structure by the second residual sacrificial layer 214R.

The second residual sacrificial layer 214R may determine the protruding length d1 of the tip 217T of the first conductive layer 217. For example, the second residual sacrificial layer 214R may be positioned farther inward than the end of the tip 217T of the first conductive layer 217, and the protruding length d1 of the tip 217T may be a length from a side wall of the second residual sacrificial layer 214R to the end (e.g., the distal end) of the tip 217T.

The second residual sacrificial layer 214R may include a material that may be selectively etched without damaging the first pixel electrode 221r, the bank layer 215, and the first conductive layer 217. For example, the second residual sacrificial layer 214R and the first residual sacrificial layer 212R may include the same material. The second residual sacrificial layer 214R may include IGZO and/or IZO.

The first emission layer 222r may be positioned over the first pixel electrode 221r and the first conductive layer 217. For example, the first emission layer 222r may be arranged to be in contact with the first pixel electrode 221r through (or in) the first opening OP1. The first pixel electrode 221r may include a polymer or a low molecular weight organic material that emits light of a first color (e.g., red). In another embodiment, the first emission layer 222r may include an inorganic material or quantum dots.

The first emission layer 222r may include a first functional layer and a second functional layer over and/or under the first emission layer 222r. The first functional layer may include a hole transport layer (HTL) and/or a hole injection layer (HIL). The second functional layer may include an electron transport layer (ETL) and/or an electron injection layer (EIL).

Although FIGS. 5 and 8 illustrate an embodiment in which the emission layer has a single stack structure including a single emission layer, in some embodiments, the display apparatus 1 may have a tandem structure, that is, a multi-stack structure, including a plurality of emission layers. When the display apparatus 1 has a tandem structure, a charge generation layer (CGL) may be between a plurality of stacks.

The first emission layer 222*r* may be disconnected from a dummy portion 222*rp* by the tip 217T of the first conductive layer 217. In such an embodiment, the first emission layer 222*r* may include the same material and/or the same number of sub-layers (e.g., the first functional layer, the second functional layer, etc.) as the dummy portion 222*rp*.

The first emission layer 222*r* may have at least one first hole (e.g., at least one first opening) 222*rh* that exposes a portion of the upper surface of the first conductive layer 217.

FIG. 6 is a schematic view of the bank layer 215, the first emission layer 222*r*, the second emission layer 222*g*, and the third emission layer 222*b* to better describe the position and shape of the first hole 222*rh* in the first emission layer 222*r*. The second emission layer 222*g* may include a polymer organic material or a low molecular weight organic material, which emits light in a second color (e.g., green), and the third emission layer 222*b* may include a polymer organic material or a low molecular weight organic material, which emits light in a third color (e.g., blue). In FIGS. 6 and 7, dummy portions 222*rp*, 222*gp*, and 222*bp* of the first to third emission layers 222*r*, 222*g*, and 222*b* are not shown.

Referring to FIG. 6, the first emission layer 222*r* may be positioned to cover the first opening OP1. In such an embodiment, the end of the first emission layer 222*r* may match (e.g., may be the same as or may be aligned with) the end of the tip 217T of the first conductive layer 217. The at least one first hole 222*rh* penetrating the first emission layer 222*r* may be between the end of the tip 217T of the first conductive layer 217 and the first opening OP1. Similarly, the second emission layer 222*g* may have at least one second hole (e.g., at least one second opening) 222*gh* penetrating the second emission layer 222*g*, and the third emission layer 222*b* may have at least one third hole (e.g., at least one third opening) 222*bh* penetrating the third emission layer 222*b*.

Although FIG. 6 illustrates an embodiment in which each pixel P1, P2, or P3 has eight first holes 222*rh*, eight second holes 222*gh*, and eight third holes 222*bh*, respectively, the number and shape of the first to third holes 222*rh*, 222*gh*, and 222*bh* are not limited thereto. In a plane view, the first to third holes 222*rh*, 222*gh*, and 222*bh* may have various shapes, such as a circular shape, an elliptical shape, or a polygonal shape.

In some embodiments, such as shown in FIG. 7, the first hole 222*rh* may be spaced apart from the first opening OP1 and may have a loop shape surrounding at least a portion of the first opening OP1. When the first hole 222*rh* entirely surrounds the first opening OP1, a first portion 222*r*1 of the first emission layer 222*r*, which is positioned inside the first hole 222*rh*, and a second portion 222*r*2 of the first emission layer 222*r*, which is positioned outside the first hole 222*rh*, may be separated from each other. Similarly, a first portion 222*g*1 of the second emission layer 222*g*, which is positioned inside the second hole 222*gh*, and a second portion 222*g*2 of the second emission layer 222*g*, which is positioned outside the second hole 222*gh*, may be separated from each other by the second hole 222*gh*. A first portion 222*b*1 of the third emission layer 222*b*, which is positioned inside the third hole 222*bh*, and a second portion 222*b*2 of the third emission layer 222*b*, which is positioned outside the third hole 222*bh*, may be separated from each other by the third hole 222*bh*. Accordingly, in a high-resolution display apparatus 1, the influence of a leakage current between first to third pixels P1, P2, and P3 adjacent to each other may be significantly reduced.

Referring back to FIG. 8, the first opposite electrode 223*r* may be disposed on the first emission layer 222*r*. The first opposite electrode 223*r* may be in direct contact with the first conductive layer 217 through (or in) the first hole 222*rh*. Accordingly, the first opposite electrode 223*r* may be electrically connected to the bank layer 215 through the first conductive layer 217.

The first opposite electrode 223*r* may be disconnected from a dummy portion 223*rp* by the tip 217T of the first conductive layer 217. The first opposite electrode 223*r* and the dummy portion 223*rp* may include the same material.

The first opposite electrode 223*r* may include a (semi-) transparent layer including Ag, Mg, Al, Pt, Pd, Au, Ni, Nd, Ir, Cr, lithium (Li), calcium (Ca), or any alloy thereof. In other embodiments, the first opposite electrode 223*r* may further include a layer, such as ITO, IZO, ZnO or $In_2O_3$, on the (semi-) transparent layer including the aforementioned material.

A first inorganic encapsulation layer 311 may be disposed on the first opposite electrode 223*r*. Because the first inorganic encapsulation layer 311 has a relatively excellent step coverage, the first inorganic encapsulation layer 311 may cover at least a portion of the exposed lower surface of the tip 217T of the first conductive layer 217. For example, the first inorganic encapsulation layer 311 may be continuously formed to cover the upper and side surfaces of the first opposite electrode 223*r*, side surfaces of the first emission layer 222*r*, the side and lower surfaces of the tip 217T of the first conductive layer 217, side surfaces of the second residual sacrificial layer 214R, and the upper surface of the bank layer 215.

The first inorganic encapsulation layer 311 may include an inorganic insulating material, such as $SiN_x$, SiON, and $SiO_x$. The first inorganic encapsulation layer 311 may be in direct contact with a metal surface on the side and lower surfaces of the tip 217T of the first conductive layer 217 to form an inorganic contact region ICR. Accordingly, the inorganic contact region ICR may form a closed loop entirely surrounding the first organic light-emitting diode OLED1 to reduce or block a path through which impurities, such as moisture and/or air, penetrate.

As shown in FIG. 5, a second inorganic encapsulation layer 312 may seal the second organic light-emitting diode OLED2, and a third inorganic encapsulation layer 313 may seal the third organic light-emitting diode OLED3. The first inorganic encapsulation layer 311, the second inorganic encapsulation layer 312, and the third inorganic encapsulation layer 313 form the inorganic contact region(s) ICR in the display area DA, and accordingly, an inorganic contact region (e.g., a size of the inorganic contact region) of the peripheral area PA (see, e.g., FIG. 3), which reduces peeling defects caused by the emission layer, may be reduced. Also, when the organic light-emitting diodes OLED are sealed in pixel units, even when a path through which impurities, such as moisture and/or air, penetrate is generated at the boundary of the substrate 100 or of one pixel P, defects caused thereby may be prevented from spreading to adjacent pixels P.

An organic planarization layer 410 may be arranged to cover the first inorganic encapsulation layer 311, the second inorganic encapsulation layer 312, and the third inorganic encapsulation layer 313. The organic planarization layer 410 may cover (e.g., may planarize) unevenness generated by the pixel-defining layer 213, the bank layer 215, and the first conductive layer 217, to provide a flat base surface for elements arranged over the organic planarization layer 410. The organic planarization layer 410 may include a polymer-based material. The polymer-based material may include an acrylic resin, an epoxy-based resin, polyimide, and polyethylene.

In an embodiment, a refractive index of the organic planarization layer 410 may be greater than those of the first inorganic encapsulation layer 311, the second inorganic encapsulation layer 312, and the third inorganic encapsulation layer 313. For example, the refractive index of the organic planarization layer 410 may be about 1.6 or more. The refractive index of the organic planarization layer 410 may be about 1.6 to about 1.9. The organic planarization layer 410 may further include dispersed particles to achieve a high refractive index. For example, metal oxide particles, such as zinc oxide ($ZnO_x$), titanium oxide ($TiO2$), zirconium oxide ($ZrO2$), and barium titanate ($BaTiO3$), may be dispersed in the organic planarization layer 410.

A protective layer 420 may be disposed on the organic planarization layer 410. The protective layer 420 may include an inorganic insulating material, such as $SiN_x$, SiON, and $SiO_x$. In an embodiment, a refractive index of the protective layer 420 may be less than the refractive index of the organic planarization layer 410.

An anti-reflection layer 500 may be positioned over the protective layer 420, and the anti-reflection layer 500 may include a first color filter 510, a second color filter 520, a third color filter 530, a light-shielding layer 540, and an overcoat layer 550. The anti-reflection layer 500 may reduce a reflectance of light (e.g., external light) incident from the outside toward the display apparatus 1.

The light-shielding layer 540 may overlap the bank layer 215 and the first conductive layer 217 to at least partially absorb light reflected by the bank layer 215 and the first conductive layer 217 in the non-emission area NEA. In such an embodiment, the non-emission area NEA may be defined as an area not overlapping (e.g., offset from) the first emission area EA1, a second emission area EA2, and a third emission area EA3. The light-shielding layer 540 may include a black pigment. The light-shielding layer 540 may include a black matrix. The light-shielding layer 540 may have a first filter opening 540OP1 corresponding to the first emission area EA1, a second filter opening 540OP2 corresponding to the second emission area EA2, and a third filter opening 540OP3 corresponding to the third emission area EA3.

The first color filter 510 may be positioned in the first filter opening 540OP1 such that the first color filter 510 corresponds to the first emission layer 222r arranged thereunder. The first color filter 510 may selectively transmit light emitted from the first emission layer 222r. For example, the first color filter 510 illustrated in FIG. 5 may include a red color filter that transmits red light.

Similarly, the second color filter 520 may be positioned in the second filter opening 540OP2 to correspond to the second emission layer 222g. The second color filter 520 may selectively transmit light emitted from the second emission layer 222g. The third color filter 530 may be positioned in the third filter opening 540OP3 to correspond to the third emission layer 222b. The third color filter 530 may selectively transmit light emitted from the third emission layer 222b. For example, the second color filter 520 illustrated in FIG. 5 may include a green color filter that transmits green light, and the third color filter 530 may include a blue color filter that transmits blue light.

The overcoat layer 550 may be disposed on the first to third color filters 510, 520, and 530. The overcoat layer 550 is a light-transmissive layer and may provide a flat upper surface by covering (or filling) unevenness generated by the first to third color filters 510, 520, and 530 and the light-shielding layer 540. The overcoat layer 550 may include a colorless light-transmissive organic material, such as an acrylic resin.

Figure 10:
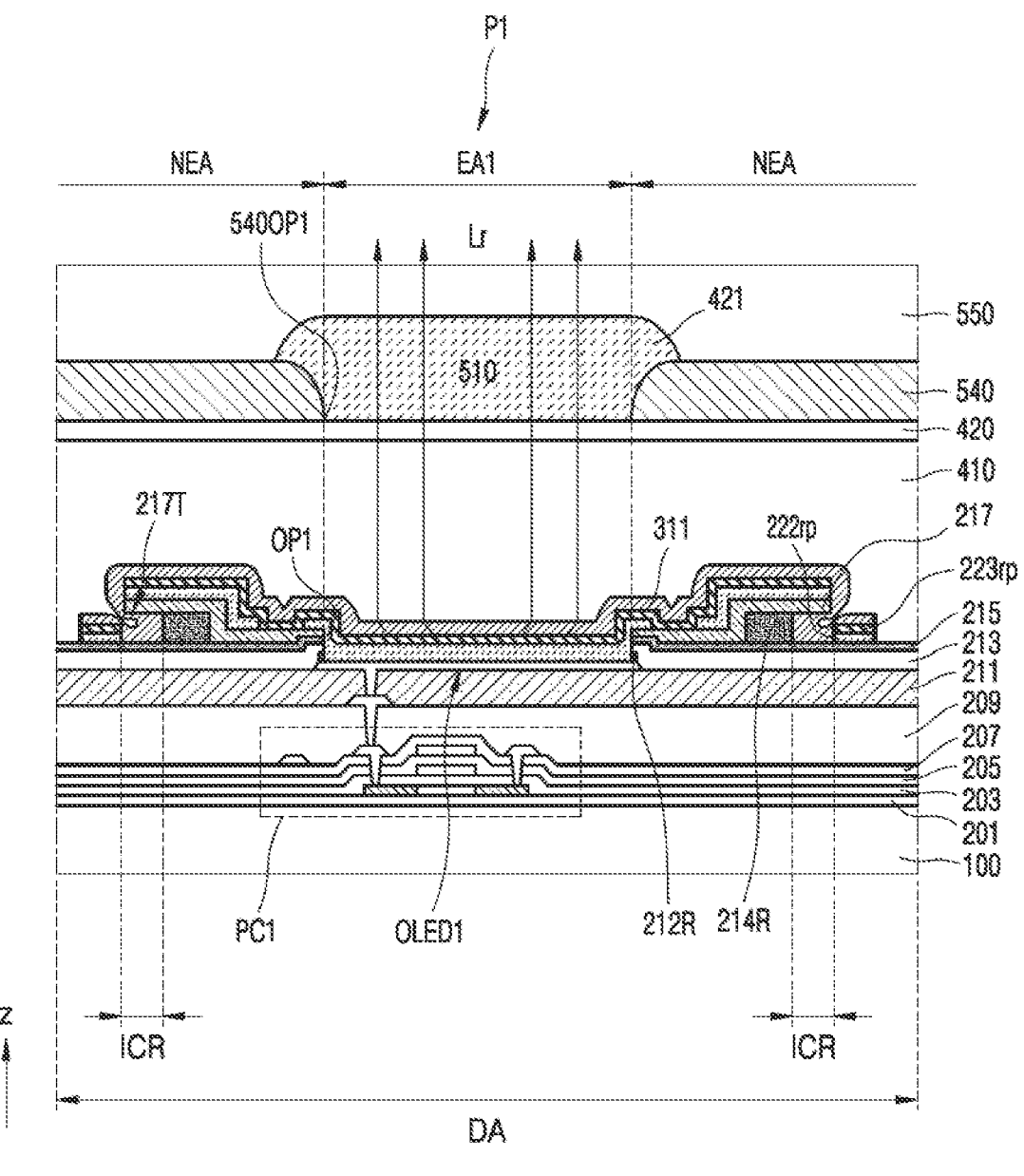
FIG. 10 is a cross-sectional view illustrating a path of light in a display apparatus according to an embodiment.

Although an embodiment in which the light-shielding layer 540 overlaps the bank layer 215 and the first conductive layer 217 is illustrated in FIGS. 8 and 10, in some embodiments, the light-shielding layer 540 may be omitted and the first color filter 510, the second color filter 520, and the third color filter 530 may overlap each other and may at least partially absorb light reflected by the bank layer 215 and the first conductive layer 217. For example, the first color filter 510 covers the display area DA of the substrate 100 and may have openings respectively overlapping the second emission area EA2 and the third emission area EA3. The second color filter 520 may cover the display area DA of the substrate 100 and may have openings respectively overlapping the first emission area EA1 and the third emission area EA3. The third color filter 530 may cover the display area DA of the substrate 100 and may have openings respectively overlapping the first emission area EA1 and the second emission area EA2. Accordingly, the first color filter 510, the second color filter 520, and the third color filter 530 may overlap each other in the non-emission area NEA excluding the first emission area EA1, the second emission area EA2, and the third emission area EA3.

Figure 9:
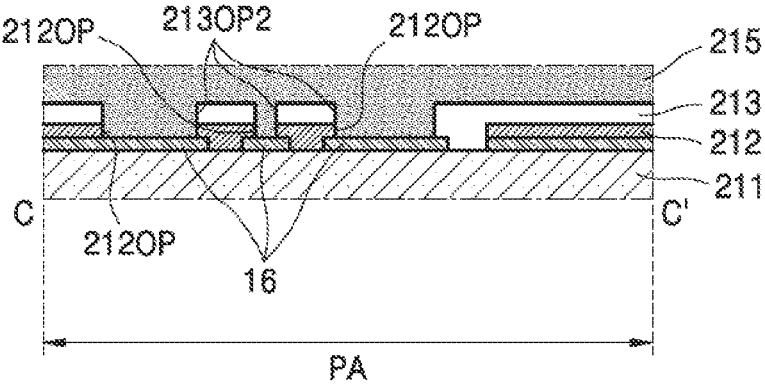
FIG. 9 is a schematic cross-sectional view of a portion of the display panel shown in FIG. 3 taken along the line C-C'.

FIG. 9 is a schematic cross-sectional view of a portion of the display panel shown in FIG. 3 taken along the line C-C'.

Referring to FIG. 9, the second organic insulating layer 211 may be positioned in the peripheral area PA of the substrate 100, and the common power supply wire 16 may be disposed on the second organic insulating layer 211. The common power supply wire 16 may include at least one metal layer disposed on the same layer as the first pixel electrode 221r (see, e.g., FIG. 5) of the display area DA. Although FIG. 9 illustrates an embodiment in which the common power supply wire 16 includes a single layer disposed on the second organic insulating layer 211, the common power supply wire 16 may include a plurality of metal layers.

A first sacrificial layer 212 may be disposed on the common power supply wire 16. The first sacrificial layer 212 may have an opening 212OP that exposes a portion of the upper surface of the common power supply wire 16. The first sacrificial layer 212 may include IGZO and/or IZO.

The pixel-defining layer 213 and the bank layer 215 may be positioned over the first sacrificial layer 212. The pixel-defining layer 213 and the bank layer 215 may extend from the display area DA (see, e.g., FIG. 3) to the peripheral area PA.

The pixel-defining layer 213 may include an inorganic insulating material, such as $SiN_x$, $SiO_x$, or $SiO_xN_y$. The pixel-defining layer 213 may have an opening 213OP2 that exposes a portion of the upper surface of the common power supply wire 16. The opening 212OP in the first sacrificial layer 212 and the opening 213OP2 in the pixel-defining layer 213 may overlap the common power supply wire 16. For example, each of the opening 212OP in the first sacrificial layer 212 and the opening 213OP2 in the pixel-defining layer 213 have a loop shape with one open side and may have a shape partially surrounding the display area DA (see, e.g., FIG. 3).

The bank layer 215 may include a conductive material including Mo, Al, Cu, Ti, or the like. The bank layer 215 may be in direct contact with the upper surface of the common power supply wire 16 exposed through the opening 212OP in the first sacrificial layer 212 and the opening 213OP2 in the pixel-defining layer 213. Accordingly, the bank layer 215 and the common power supply wire 16 may be electrically connected to each other.

As described above with reference to FIGS. 5 and 8, the first conductive layer 217 (see, e.g., FIG. 5) may be disposed on the bank layer 215, and the bank layer 215 and the first conductive layer 217 may be electrically connected to each other. The common power supply wire 16 may be configured to transmit the common voltage ELVSS to the first opposite electrode 223r, the second opposite electrode 223g, and the third opposite electrode 223b through the bank layer 215 and the first conductive layer 217 (see, e.g., FIG. 5).

FIG. 10 is a cross-sectional view describing a path of light emitted from the display apparatus according to an embodiment. FIG. 10 describes a path of light emitted from the first organic light-emitting diode OLED1 when the organic planarization layer 410 has a relatively high refractive index.

As described above, the organic planarization layer 410 may have a refractive index higher than a refractive index of the first inorganic encapsulation layer 311. For example, the refractive index of the organic planarization layer 410 may be in a range of about 1.6 to about 1.9, and the refractive index of the first inorganic encapsulation layer 311 may be in a range of about 1.4 to about 1.5.

First light Lr emitted from the first emission layer 222r of the first organic light-emitting diode OLED1 may travel in an oblique direction with respect to a direction (e.g., the z-axis direction) perpendicular to the upper surface of the substrate 100, may be refracted at an interface between the first inorganic encapsulation layer 311 and the organic planarization layer 410, and travel in the direction (e.g., the z-axis direction) perpendicular to the upper surface of the substrate 100. Accordingly, light output efficiency (e.g., front light output efficiency) of the display apparatus may be improved.

In an embodiment, the protective layer 420 disposed on the organic planarization layer 410 may have a refractive index lower than the refractive index of the organic planarization layer 410. Accordingly, a path of the first light Lr traveling in the direction (e.g., the z-axis direction) perpendicular to the upper surface of the substrate 100 may be maintained even at the interface between the organic planarization layer 410 and the protective layer 420 by the organic planarization layer 410.

As a comparative example, when a refractive index of an organic planarization layer is relatively low, first light Lr emitted from a first emission layer is not refracted and travels in an oblique direction with respect to a direction perpendicular to the upper surface of a substrate along an original traveling path, and thus, the first light Lr may not (or relatively little of the first light Lr may) reach eyes of a user looking at the display apparatus from the front. Therefore, a light path control layer for controlling a light path is additionally formed over an encapsulation layer, and accordingly, the thickness of the display apparatus may increase. However, according to embodiments, because the organic planarization layer 410 has a relatively high refractive index, the light output efficiency may be improved without increasing the thickness of the display apparatus.

FIGS. 11 to 24 are cross-sectional views sequentially illustrating some steps of a method of manufacturing a display apparatus according to embodiments. FIGS. 11 to 15 are enlarged views of an area adjacent to the first pixel P1 and describe a manufacturing process of a pixel in more detail. FIGS. 16 to 24 illustrate a manufacturing process of the display apparatus 1 including the first pixel P1, the second pixel P2, and third pixel P3.

Figure 11:
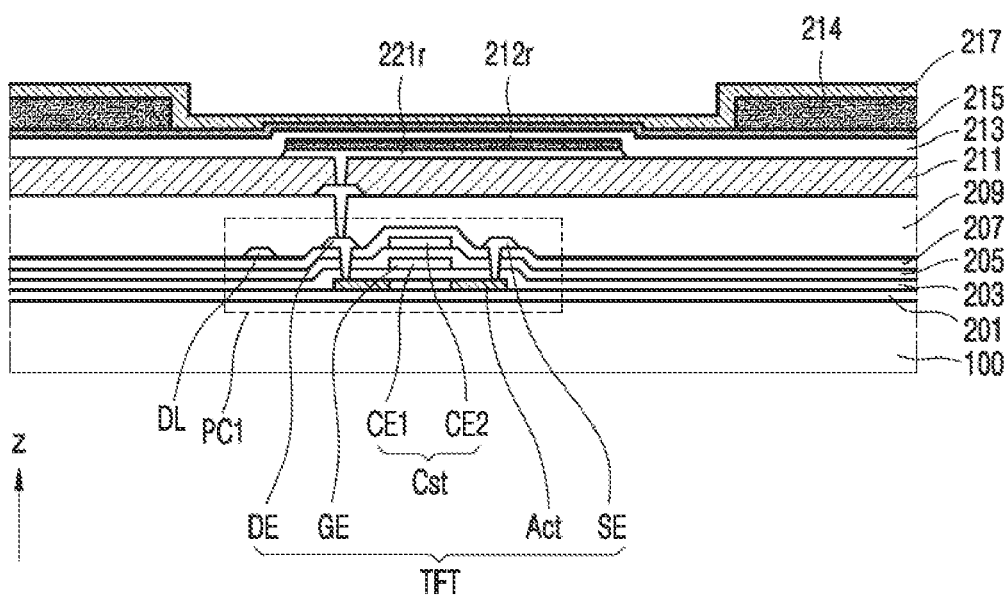
FIGS. 11 to 24 are cross-sectional views sequentially illustrating some steps of a method of manufacturing a display apparatus according to embodiments.

Referring to FIG. 11, the first pixel circuit PC1 may be formed on the substrate 100. The first pixel circuit PC1 may include the thin-film transistor TFT and the storage capacitor Cst. The thin-film transistor TFT may include the semiconductor layer Act, the gate electrode GE, the source electrode SE, and the drain electrode DE.

The substrate 100 may include a glass material or a polymer resin. The buffer layer 201 formed to prevent impurities from penetrating into the semiconductor layer Act of the thin-film transistor TFT, the gate insulating layer 203 between the semiconductor layer Act and the gate electrode GE, the first interlayer insulating layer 205 between the lower electrode CE1 and the upper electrode CE2 of the storage capacitor Cst, and the second interlayer insulating layer 207 for insulating the source electrode SE, the drain electrode DE, and the gate electrode GE of the thin-film transistor TFT may be formed on the substrate 100.

The first organic insulating layer 209 and the second organic insulating layer 211, which cover the first pixel circuit PC1, may be formed over the second interlayer insulating layer 207. The second organic insulating layer 211 may have a substantially flat upper surface.

The first pixel electrode 221r, which is electrically connected to the first pixel circuit PC1, may be formed on the second organic insulating layer 211. The first pixel electrode 221r may be electrically connected to the first pixel circuit PC1 through the contact metal layer CM between the first organic insulating layer 209 and the second organic insulating layer 211. The first pixel electrode 221r may include a conductive oxide, such as ITO, IZO, ZnO, $In_2O_3$, IGO, or AZO.

A $(1-1)^{st}$ sacrificial layer 212r may be formed on the first pixel electrode 221r. The $(1-1)^{st}$ sacrificial layer 212r may include IGZO and/or IZO. The first pixel electrode 221r and the $(1-1)^{st}$ sacrificial layer 212r may be continuously formed by using the same mask. Accordingly, the $(1-1)^{st}$ sacrificial layer 212r may have substantially the same shape as the first pixel electrode 221r and may cover the first pixel electrode 221r.

The pixel-defining layer 213 and the bank layer 215 may sequentially formed over the $(1-1)^{st}$ sacrificial layer 212r. The pixel-defining layer 213 may include an inorganic insulating material, such as $SiN_x$, $SiO_x$, and $SiO_xN_y$. The bank layer 215 may include a conductive material including Mo, Al, Cu, Ti, or the like and may include a single layer or a multi-layer structure, each including the above material. For example, the bank layer 215 may be formed to have a double-layered structure of Al/Ti or a triple-layered structure of Ti/Al/Ti.

A second sacrificial layer 214 entirely surrounding the first pixel electrode 221r may be formed on the bank layer 215. The second sacrificial layer 214 may be spaced apart from the edge of the first pixel electrode 221r. For example, the second sacrificial layer 214 is formed over the front surface of the substrate 100 and may have an opening overlapping the first pixel electrode 221r. The second sacrificial layer 214 may include IGZO and/or IZO.

The first conductive layer 217 may be formed over the bank layer 215 and the second sacrificial layer 214. The first conductive layer 217 may be formed to be in direct contact with the upper surface of the bank layer 215 exposed by (or through) the opening in the second sacrificial layer 214. The first conductive layer 217 may include a conductive material including Mo, Al, Cu, Ti, or the like and may include a single layer or a multi-layer structure, each including the above material.

A low reflection layer may be formed over the first conductive layer 217. The low reflection layer may be a layer having a surface reflectance lower than that of the first conductive layer 217. The low reflection layer may include a metal oxide having a high extinction coefficient (k). For example, the low reflection layer may include at least one of CuO, CaO, $MoO_x$, and ZnO. In some embodiments, the low reflection layer may include a material in which CuO and CaO are mixed.

Figure 12:
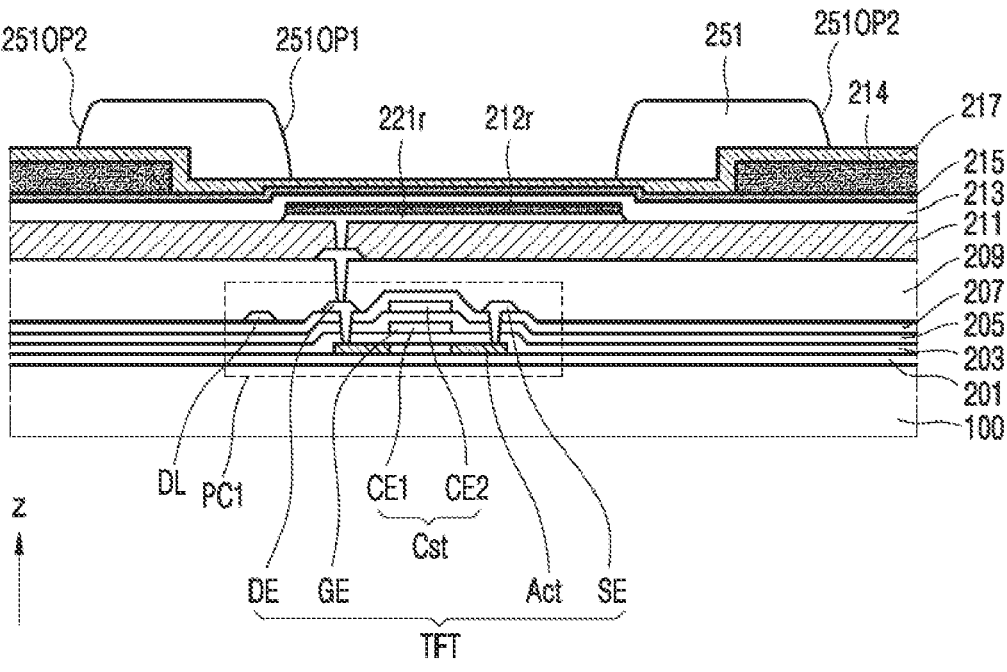

Referring to FIG. 12, a first photoresist 251 may be formed on the first conductive layer 217. The first photoresist 251 may be patterned to have an opening that exposes a portion of the upper surface of the first conductive layer 217. For example, a first opening 251OP1 in the first photoresist 251 may overlap the first pixel electrode 221r, and a second opening 251OP2 in the first photoresist 251 may overlap the second sacrificial layer 214 and may have a loop shape entirely surrounding (e.g., extending entirely around) the first pixel electrode 221r.

Figure 13:
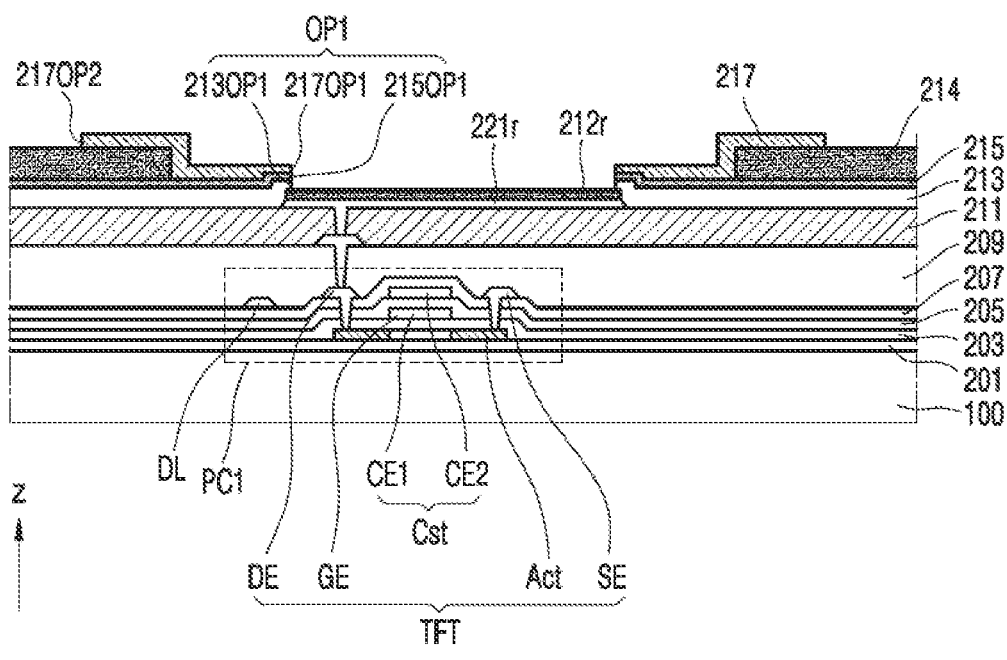

Referring to FIG. 13, portions of the pixel-defining layer 213, the bank layer 215, and the first conductive layer 217 may be removed by using the first photoresist 251, illustrated in FIG. 12, as a mask. For example, a portion of the first conductive layer 217, a portion of the bank layer 215, and a portion of the pixel-defining layer 213 may be sequentially removed at (or through) the first opening 251OP1 in the first photoresist 251, and a portion of the first conductive layer 217 may be removed at (or through) the second opening 251OP2 in the first photoresist 251 to form a sub-opening 217OP2. The portion of the first conductive layer 217, the portion of the bank layer 215, and the portion of the pixel-defining layer 213 may be removed by dry etching. During an etching process, the $(1-1)^{st}$ sacrificial layer 212r may protect the first pixel electrode 221r thereunder, and the second sacrificial layer 214 may protect the bank layer 215 thereunder.

During the etching process, the first sub-opening 213OP1 may be formed in the pixel-defining layer 213, the second sub-opening 215OP1 may be formed in the bank layer 215, and the third sub-opening 217OP1 may be formed in the first conductive layer 217. The first sub-opening 213OP1, the second sub-opening 215OP1, and the third sub-opening 217OP1 may overlap each other and may together form the first opening OP1 penetrating the pixel-defining layer 213, the bank layer 215, and the first conductive layer 217.

Thereafter, the first photoresist 251 is removed.

Figure 14:
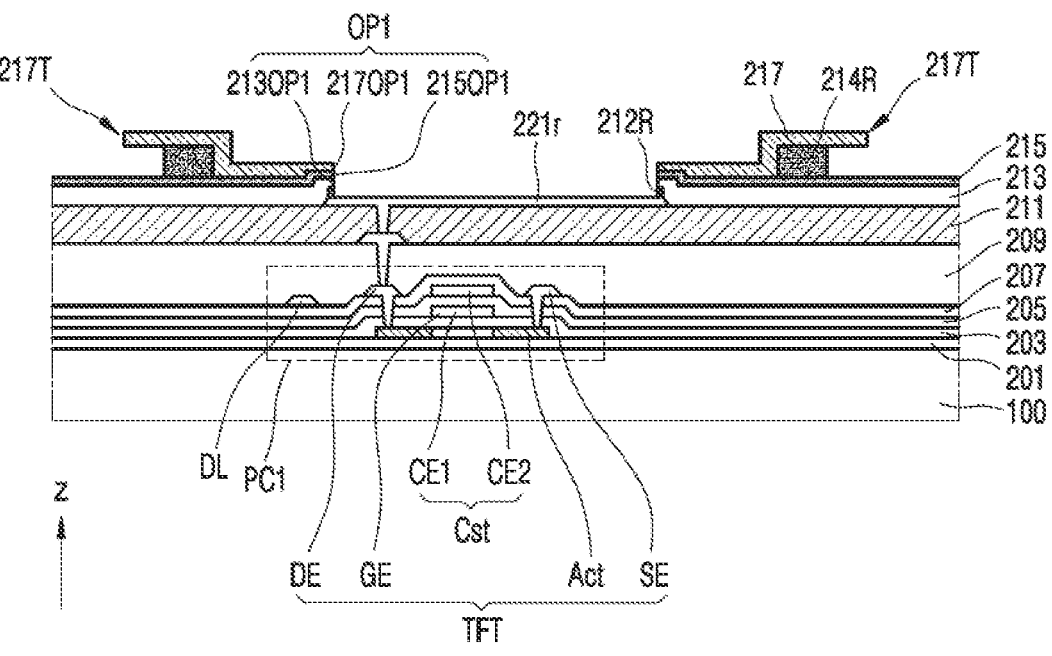

Referring to FIG. 14, at least a portion of the $(1-1)^{st}$ sacrificial layer 212r and a portion of the second sacrificial layer 214 may be removed. At least the portion of the $(1-1)^{st}$ sacrificial layer 212r and the portion of the second sacrificial layer 214 may be removed by wet etching. The $(1-1)^{st}$ sacrificial layer 212r is removed, and accordingly, the upper surface of the first pixel electrode 221r may be exposed through the first opening OP1. In such an embodiment, a portion of the $(1-1)^{st}$ sacrificial layer 212r overlapping the pixel-defining layer 213 may not be removed, and thus, the first residual sacrificial layer 212R may be formed. The first residual sacrificial layer 212R may cover the edge of the first pixel electrode 221r. In other embodiments, the $(1-1)^{st}$ sacrificial layer 212r is entirely removed, and a groove may be formed between the pixel-defining layer 213 and the first pixel electrode 221r.

A portion of the second sacrificial layer 214 positioned under the first conductive layer 217 may not be removed, and the second residual sacrificial layer 214R may be formed. When viewed in the direction (e.g., the z-axis direction) substantially perpendicular to the substrate 100, the second residual sacrificial layer 214R may be spaced apart from the first pixel electrode 221r by a distance and may have a loop shape entirely surrounding the first pixel electrode 221r. The second sacrificial layer 214 may be sufficiently etched to have an undercut structure in which the upper surface of the first conductive layer 217 protrudes from (e.g., protrudes beyond) a side surface of the second residual sacrificial layer 214R. Accordingly, the tip 217T of the first conductive layer 217 may have an eave structure with an exposed lower surface. The tip 217T of the first conductive layer 217 may protrude about 0.5 μm or more from (or beyond) the side surface of the second residual sacrificial layer 214R.

Figure 15:
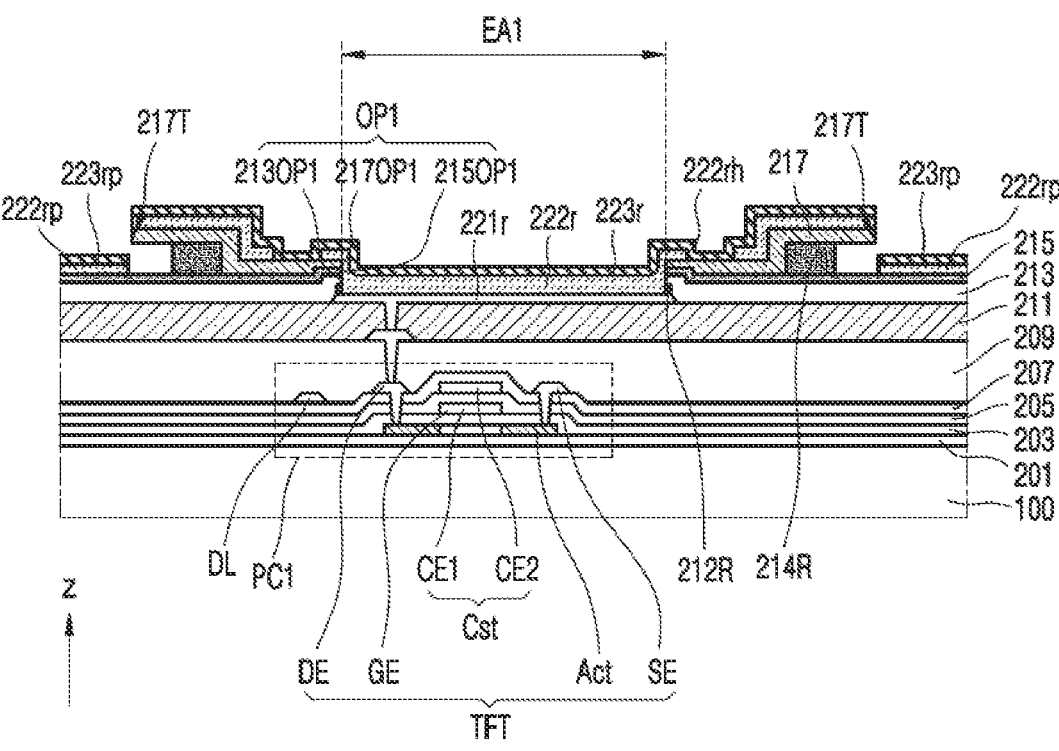

Referring to FIG. 15, the first emission layer 222r and the first opposite electrode 223r may be sequentially formed to cover the bank layer 215, the first conductive layer 217, and the first pixel electrode 221r. In some embodiments, the first emission layer 222r and the first opposite electrode 223r may be formed by a deposition method, such as thermal evaporation or sputtering. Because a material forming the first emission layer 222r and a material forming the first opposite electrode 223r are deposited on the front surface of the substrate 100, an open mask or a fine metal mask may not be used in a formation process.

The first emission layer 222r may include a polymer organic material or a low molecular weight organic material, which is configured to emit light of a first color. The first emission layer 222r may include a first functional layer and a second functional layer thereover and/or thereunder and may have a single stack structure or a tandem structure.

The first emission layer 222r may be disconnected from the dummy portion 222rp by the tip 217T of the first conductive layer 217. The first emission layer 222r may include the same material and/or the same number of sub-layers (e.g., the first functional layer, the second functional layer, etc.) as the dummy portion 222rp.

At least one first hole (e.g., at least first opening) 222rh that exposes a portion of the upper surface of the first conductive layer 217 may be formed in the first emission layer 222r. The first hole 222rh may be formed through a laser drilling process. In some embodiments, as shown in FIG. 6, the first hole 222rh may be provided as a plurality of first holes 222rh adjacent to the first opening OP1. In other embodiments, as shown in FIG. 7, the first hole 222rh may have a loop shape entirely surrounding the first opening OP1.

The first opposite electrode 223r may be disconnected from the dummy portion 223rp by the tip 217T of the first conductive layer 217. The first opposite electrode 223r and the dummy portion 223rp may include the same material and/or the same number of sub-layers.

The first opposite electrode 223r may be in direct contact with the upper surface of first conductive layer 217 through the first hole 222rh. Accordingly, the first opposite electrode 223r may be electrically connected to the bank layer 215 through the first conductive layer 217.

Figure 16:
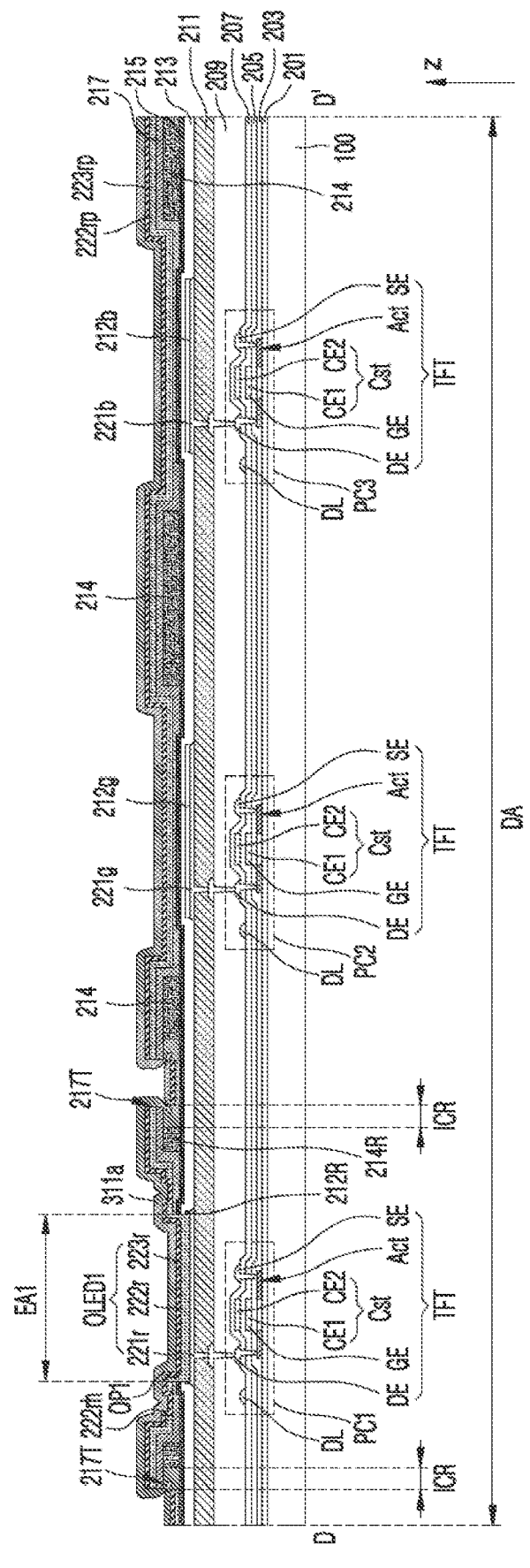

Referring to FIG. 16, the second pixel circuit PC2, the second pixel electrode 221g electrically connected to the second pixel circuit PC2, the third pixel circuit PC3, and the third pixel electrode 221b electrically connected to the third pixel circuit PC3 may be positioned over the substrate 100.

A $(1-2)^{nd}$ sacrificial layer 212g may be disposed on the second pixel electrode 221g, and a $(1-3)^{rd}$ sacrificial layer 212b may be disposed on the third pixel electrode 221b. The first pixel electrode 221r, the second pixel electrode 221g, and the third pixel electrode 221b may be formed by the same process. Similarly, the $(1-1)^{st}$ sacrificial layer 212r, the $(1-2)^{nd}$ sacrificial layer 212g, and the $(1-3)^{rd}$ sacrificial layer 212b may be formed by the same process. For example, the first pixel electrode 221r, the $(1-1)^{st}$ sacrificial layer 212r, the second pixel electrode 221g, the $(1-2)^{nd}$ sacrificial layer 212g, the third pixel electrode 221b, and the $(1-3)^{rd}$ sacrificial layer 212b may be patterned together in the same process.

Because the first emission layer 222r and the first opposite electrode 223r are deposited without a separate mask, the dummy portion 222rp of the first emission layer 222r and the dummy portion 223rp of the first opposite electrode 223r may also be formed over the second pixel electrode 221g and the third pixel electrode 221b.

A first inorganic insulating layer 311a may be formed on the first opposite electrode 223r and the dummy portion 223rp. The first inorganic insulating layer 311a is formed over the front surface of the substrate 100 and may also be formed over the second pixel electrode 221g and the third pixel electrode 221b. The first inorganic insulating layer 311a may include an inorganic insulating material, such as $SiN_x$, SiON, and $SiO_x$.

Because the first inorganic insulating layer 311a has a relatively high step coverage, the first inorganic insulating layer 311a is in direct contact with a metal surface on the side and lower surfaces of the tip 217T of the first conductive layer 217 and, thus, may form the inorganic contact region ICR. Accordingly, the inorganic contact region ICR forms a closed loop entirely surrounding the first organic light-emitting diode OLED1 including the first pixel electrode 221r, the first emission layer 222r, and the first opposite electrode 223r, and thus, a path through which impurities, such as moisture and/or air, penetrate may be reduced or blocked.

Figure 17:
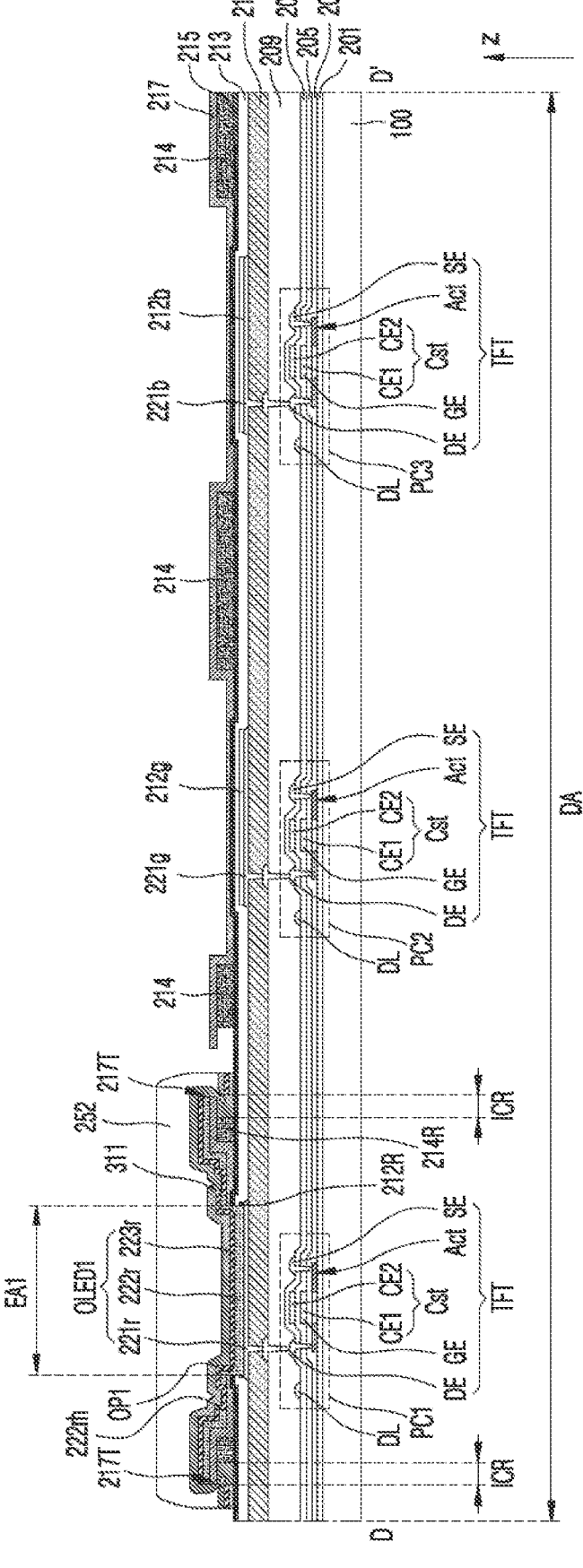

Referring to FIG. 17, a second photoresist 252 may be formed on the first inorganic insulating layer 311a, and a portion of the first inorganic insulating layer 311a, a portion of the dummy portion 222rp of the first emission layer 222r, and a portion of the dummy portion 223rp of the first opposite electrode 223r may be removed by using the second photoresist 252 as a mask.

When the first inorganic encapsulation layer 311 is formed by removing the portion of the first inorganic insulating layer 311a, the second photoresist 252 may cover the end of the tip 217T of the first conductive layer 217, such that the inorganic contact region ICR is not damaged. Accordingly, a portion of the dummy portion 222rp of the first emission layer 222r and a portion of the dummy portion 223rp of the first opposite electrode 223r, which are adjacent to the end of the tip 217T of the first conductive layer 217, may not be removed.

When the dummy portion 222rp of the first emission layer 222r and the dummy portion 223rp of the first opposite electrode 223r, which are not covered by the second photoresist 252, are etched, the first conductive layer 217 may act as a barrier layer and protect layers thereunder.

Thereafter, the second photoresist 252 is removed.

Figure 18:
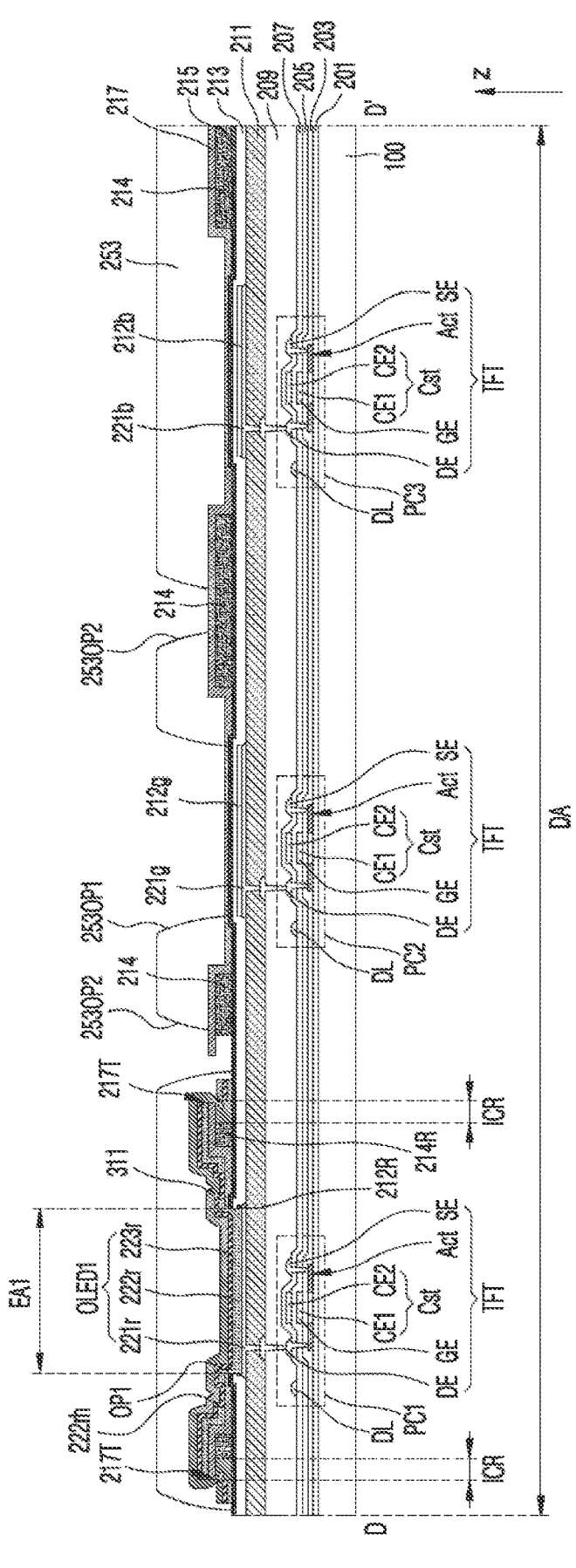

Referring to FIG. 18, a third photoresist 253 may be formed on the first inorganic encapsulation layer 311 and the first conductive layer 217. The third photoresist 253 may be patterned to have an opening that exposes a portion of the upper surface of the first conductive layer 217. For example, a first opening 253OP1 in the third photoresist 253 may overlap the second pixel electrode 221g. A second opening 253OP2 in the third photoresist 253 overlaps the second sacrificial layer 214 adjacent to the second pixel electrode 221g and may have a loop shape entirely surrounding the second pixel electrode 221g.

Figure 19:
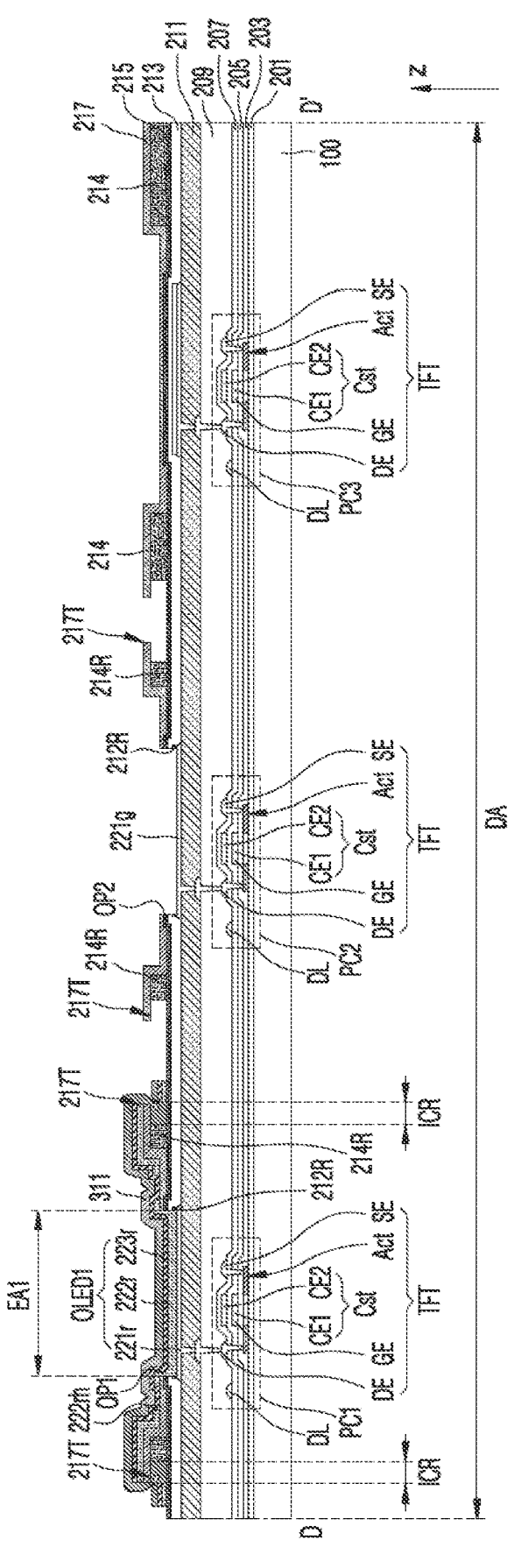

Referring to FIG. 19, portions of the pixel-defining layer 213, the bank layer 215, and the first conductive layer 217 may be removed by using the third photoresist 253 as a mask. For example, a portion of the first conductive layer 217, a portion of the bank layer 215, and a portion of the pixel-defining layer 213 may be sequentially removed at (or through) the first opening 253OP1 in the third photoresist 253 such that a second opening OP2 may be formed. A portion of the first conductive layer 217 may be removed at (or through) a second opening 253OP2 in the third photoresist 253. During an etching process, the $(1-2)^{nd}$ sacrificial layer 212g may protect the second pixel electrode 221g thereunder, and the second sacrificial layer 214 may protect the bank layer 215 thereunder.

A detailed process and structural characteristics of removing the portions of the pixel-defining layer 213, the bank layer 215, and the first conductive layer 217 are the same as described above with reference to FIGS. 12 and 13.

Thereafter, at least a portion of the $(1-2)^{nd}$ sacrificial layer 212g and a portion of the second sacrificial layer 214 may be removed by using wet etching. The $(1-2)^{nd}$ sacrificial layer 212g is removed, and accordingly, the upper surface of the second pixel electrode 221g may be exposed through the second opening OP2.

A detailed process and structural characteristics of removing at least the portion of the $(1-2)^{nd}$ sacrificial layer 212g and the portion of the second sacrificial layer 214 are the same as described above with reference to FIG. 14. For example, a portion of the $(1-2)^{nd}$ sacrificial layer 212g may not be removed, and the first residual sacrificial layer 212R covering the edge of the second pixel electrode 221g may be formed. A portion of the second sacrificial layer 214 positioned under the first conductive layer 217 may not be removed, and the second residual sacrificial layer 214R spaced apart from the second pixel electrode 221g by a distance and having a loop shape entirely surrounding the second pixel electrode 221g may be formed. The second sacrificial layer 214 may be sufficiently etched to have an undercut structure in which the upper surface of the first conductive layer 217 protrudes from (e.g., protrudes beyond) the side surface of the second residual sacrificial layer 214R, and the tip 217T of the first conductive layer 217 may have an eave structure with an exposed lower surface.

Figure 20:
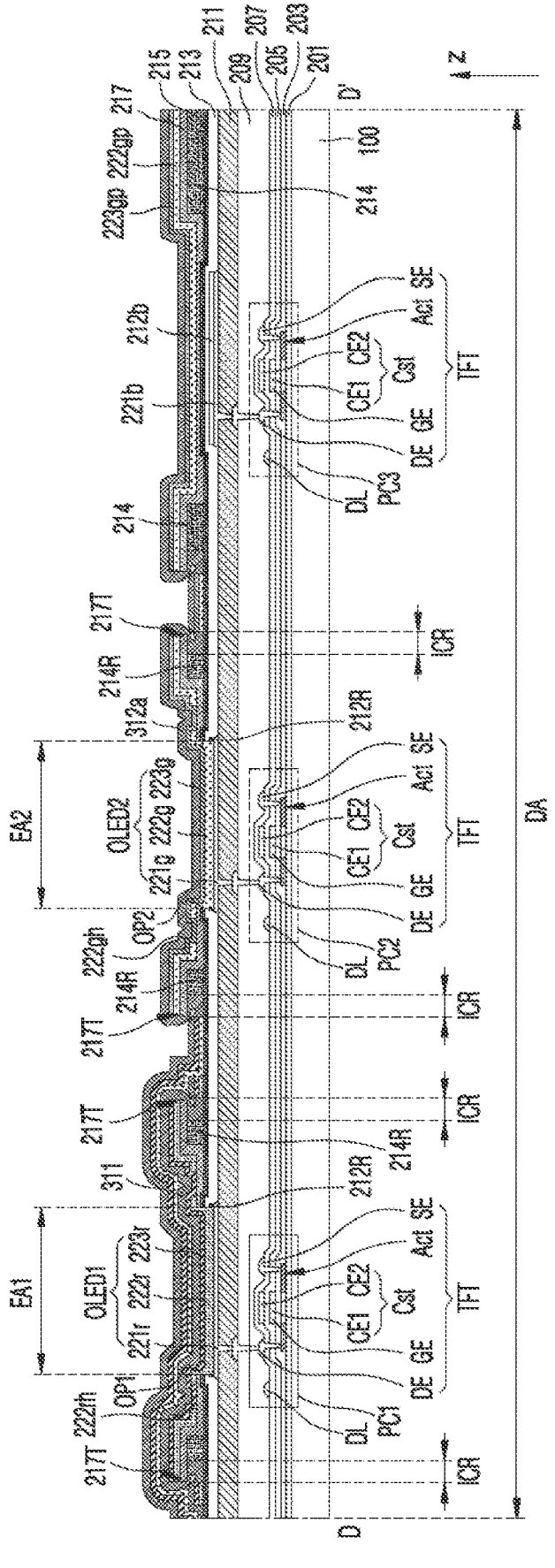

Referring to FIG. 20, the second emission layer 222g, the second opposite electrode 223g, and a second inorganic insulating layer 312a may be sequentially formed over the structure described with reference to FIG. 19.

The second emission layer 222g may include a polymer organic material or a low molecular weight organic material, which is configured to emit light of a second color. The second emission layer 222g may include a first functional layer and a second functional layer thereover and/or thereunder and may have a single stack structure or a tandem structure.

The second emission layer 222g may be disconnected from a dummy portion 222gp by the tip 217T of the first conductive layer 217. The second emission layer 222g may include the same material and/or the same number of sub-layers (e.g., the first functional layer, the second functional layer, etc.) as the dummy portion 222gp.

At least one second hole (e.g., at least one second opening) 222gh that exposes a portion of the upper surface of the first conductive layer 217 may be formed in the second emission layer 222g. The second hole 222gh may be formed by a laser drilling process.

The second opposite electrode 223g may be disconnected from a dummy portion 223gp by the tip 217T of the first conductive layer 217. The second opposite electrode 223g and the dummy portion 223gp may include the same material and/or the same number of sub-layers.

Because the second emission layer 222g and the second opposite electrode 223g are deposited without a separate mask, the dummy portion 222gp of the second emission layer 222g and the dummy portion 223gp of the second opposite electrode 223g may also be formed over the first pixel electrode 221r and the third pixel electrode 221b.

A second inorganic insulating layer 312a may be formed on the second opposite electrode 223g and the dummy portion 223gp. The second inorganic insulating layer 312a is formed over the front surface of the substrate 100 and may also be formed over the first pixel electrode 221r and the third pixel electrode 221b. The second inorganic insulating layer 312a may include an inorganic insulating material, such as SiN$_x$, SiON, and SiO$_x$.

Because the second inorganic insulating layer 312a has a relatively high step coverage, the second inorganic insulating layer 312a may continuously cover the structure thereunder. Accordingly, the second inorganic insulating layer 312a may be in direct contact with a metal surface on the side and lower surfaces of the tip 217T of the first conductive layer 217 to form the inorganic contact region ICR. Therefore, the inorganic contact region ICR may form a closed loop entirely surrounding the second organic light-emitting diode OLED2.

Figure 21:
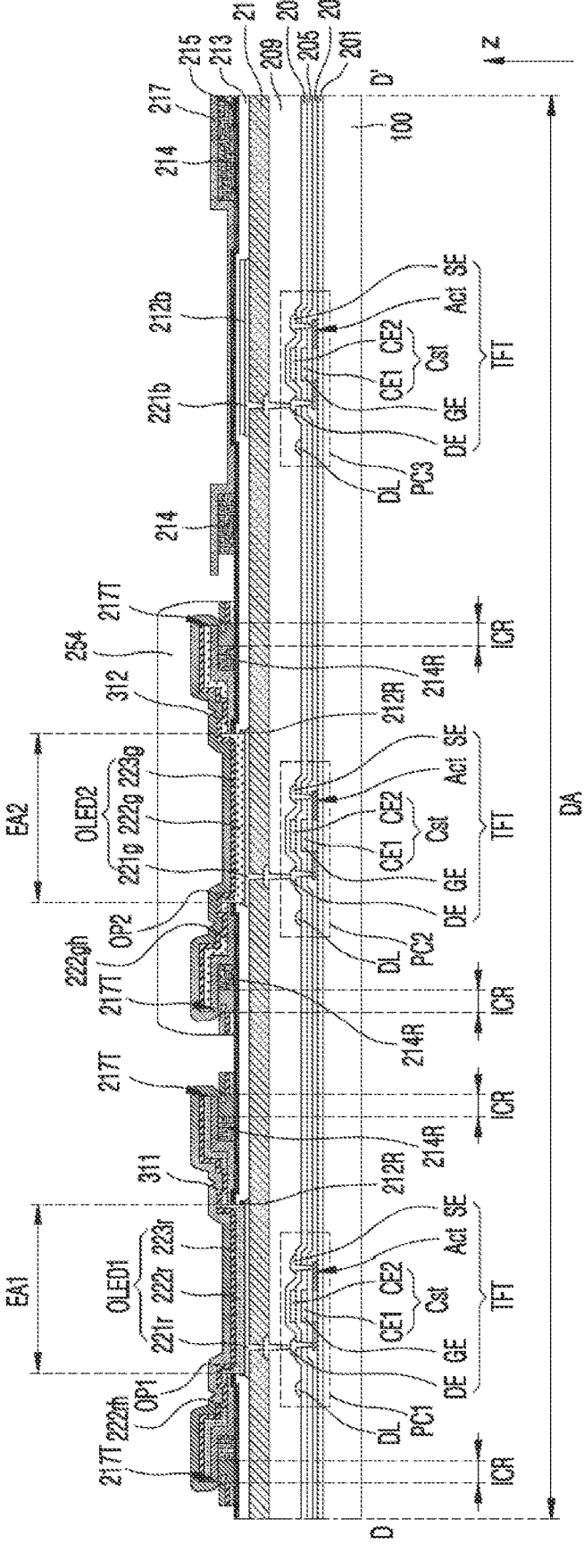

Referring to FIG. 21, a fourth photoresist 254 may be formed on the second inorganic insulating layer 312a, and a portion of the second inorganic insulating layer 312a, a portion of the dummy portion 222gp of the second emission layer 222g, and a portion of the dummy portion 223gp of the second opposite electrode 223g may be removed by using the fourth photoresist 254 as a mask.

When the second inorganic encapsulation layer 312 is formed by removing the portion of the second inorganic insulating layer 312a, the fourth photoresist 254 may cover the end of the tip 217T of the first conductive layer 217 such that the inorganic contact region ICR is not damaged. Accordingly, a portion of the dummy portion 222gp of the second emission layer 222g and a portion of the dummy portion 223gp of the second opposite electrode 223g, which are adjacent to the end of the tip 217T of the first conductive layer 217, may not be removed.

Thereafter, the fourth photoresist 254 is removed.

Figure 22:
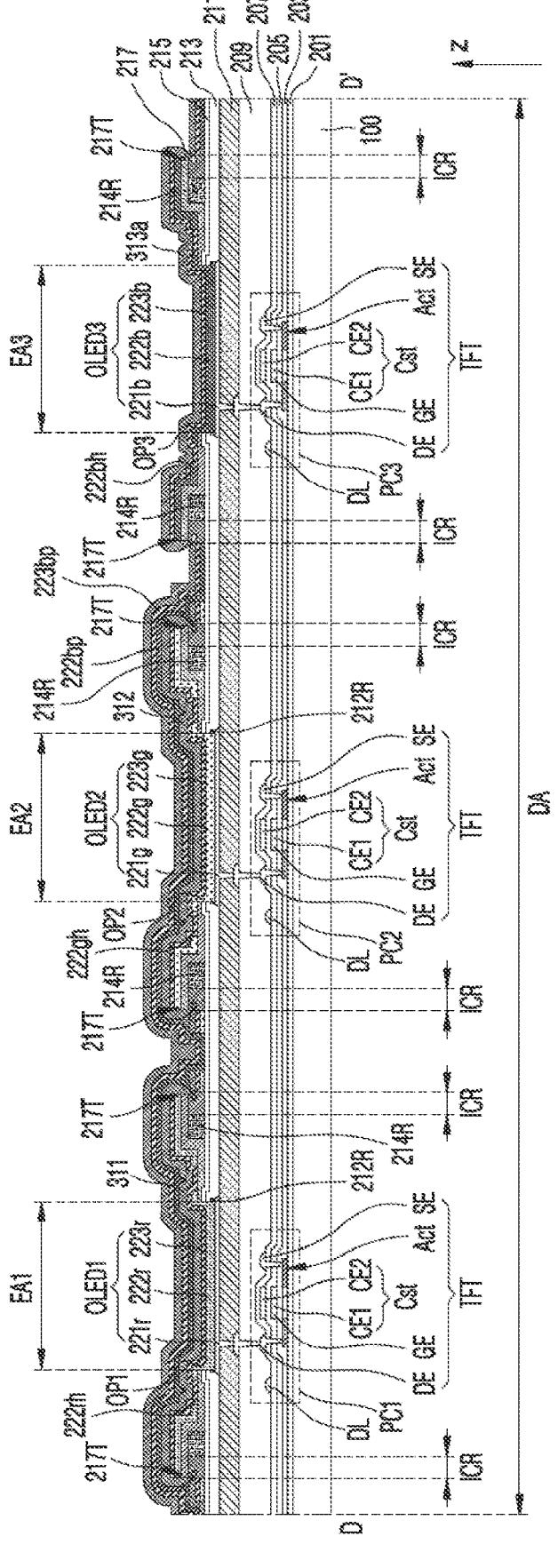

Referring to FIG. 22, the third organic light-emitting diode OLED3 including the third pixel electrode 221b, the third emission layer 222b, and the third opposite electrode 223b may be formed, and a third inorganic insulating layer 313a sealing the third organic light-emitting diode OLED3 may be formed. A process of forming the third organic light-emitting diode OLED3 and the third inorganic insulating layer 313a is similar to the process of forming the first organic light-emitting diode OLED1 and the first inorganic insulating layer 311a described with reference to FIGS. 12 to 16.

For example, a third opening OP3 may be formed by removing a portion of the first conductive layer 217, a portion of the bank layer 215, and a portion of the pixel-defining layer 213, and a portion of the upper surface of the second sacrificial layer 214 and a portion of the upper surface of the (1-3)$^{rd}$ sacrificial layer 212b may be exposed. The upper surface of the third pixel electrode 221b may be exposed by removing the (1-3)$^{rd}$ sacrificial layer 212b exposed through the third opening OP3. By removing the portion of the second sacrificial layer 214, the second residual sacrificial layer 214R positioned under the first conductive layer 217 and having a loop shape entirely surrounding the third pixel electrode 221b may be formed. The upper surface of the first conductive layer 217 may protrude from (e.g., protrude beyond) a side surface of the second residual sacrificial layer 214R to form the tip 217T of the first conductive layer 217 with an exposed lower surface.

The third emission layer 222b and the third opposite electrode 223b may be sequentially formed to cover the first inorganic encapsulation layer 311, the second inorganic encapsulation layer 312, and the first conductive layer 217. Because a material forming the third emission layer 222b and a material forming the third opposite electrode 223b are deposited without a separate mask, a dummy portion 222bp of the third emission layer 222b and a dummy portion 223bp of the third opposite electrode 223b may also be formed over the first pixel electrode 221r and the second pixel electrode 221g.

The third emission layer 222b may include a polymer organic material or a low molecular weight organic material, which is configured to emit light of a third color. At least one third hole (e.g., at least one third opening) 222bh that exposes a portion of the upper surface of the first conductive layer 217 may be formed in the third emission layer 222b. The third hole 222bh may be formed by a laser drilling process.

The third opposite electrode 223b may be in direct contact with the upper surface of first conductive layer 217 through the third hole 222bh. Accordingly, the third opposite electrode 223b may be electrically connected to the bank layer 215 through the first conductive layer 217.

The third emission layer 222b may be disconnected from the dummy portion 222bp by the tip 217T of the first conductive layer 217. Similarly, the third opposite electrode 223b may be disconnected from the dummy portion 223bp by the tip 217T of the first conductive layer 217.

The third inorganic insulating layer 313a is formed over the front surface of the substrate 100 and may also be formed over the first pixel electrode 221r and the second pixel electrode 221g. The third inorganic insulating layer 313a may include an inorganic insulating material, such as SiN$_x$, SiON, and SiO$_x$.

Because the third inorganic insulating layer 313a has a relatively high step coverage, the third inorganic insulating layer 313a may continuously cover the structure thereunder. Accordingly, the third inorganic insulating layer 313a may be in direct contact with a metal surface on the side and lower surfaces of the tip 217T of the first conductive layer 217 to form the inorganic contact region ICR. Therefore, the inorganic contact region ICR may form a closed loop entirely surrounding the third organic light-emitting diode OLED3.

Figure 23:
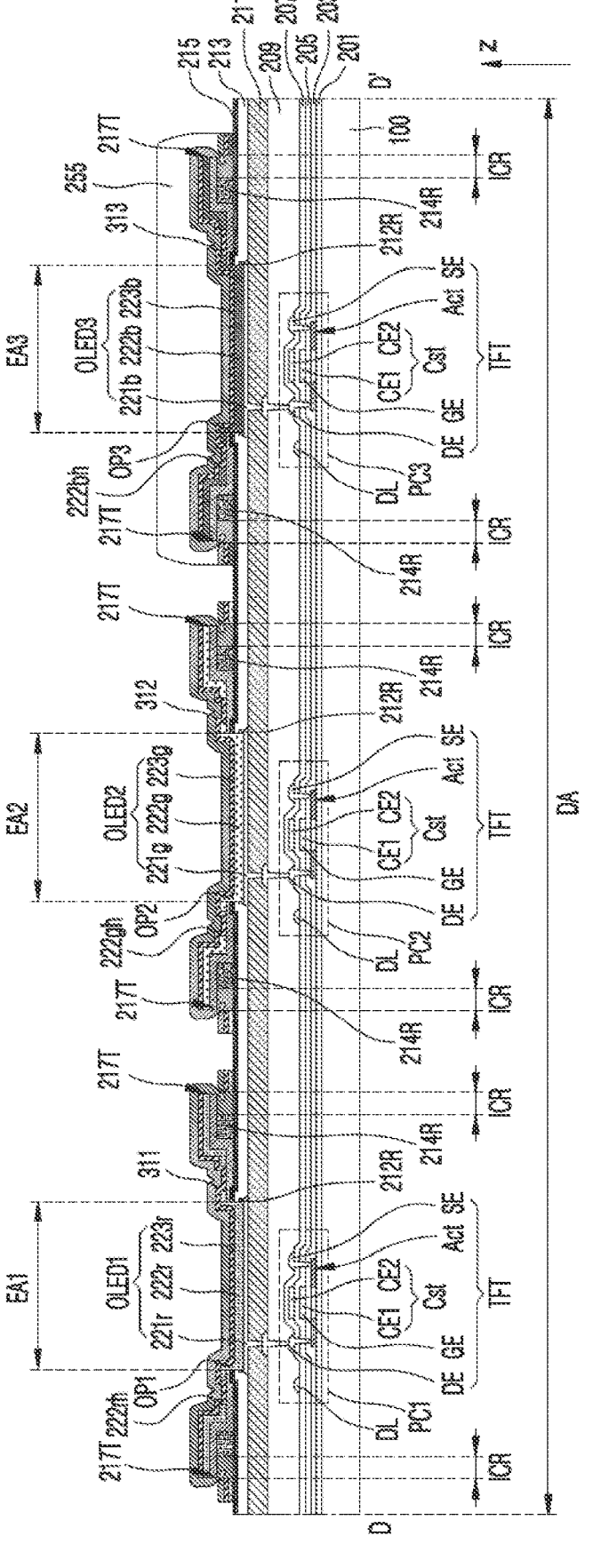

Referring to FIG. 23, a fifth photoresist 255 may be formed on the third inorganic insulating layer 313a, and a portion of the third inorganic insulating layer 313a, a portion of the dummy portion 222bp of the third emission layer 222b, and a portion of the dummy portion 223bp of the third opposite electrode 223b may be removed by using the fifth photoresist 255 as a mask.

When the third inorganic encapsulation layer 313 is formed by removing the portion of the third inorganic insulating layer 313a, the fifth photoresist 255 may cover the end of the tip 217T of the first conductive layer 217 such that the inorganic contact region ICR is not damaged. Accordingly, a portion of the dummy portion 222bp of the third emission layer 222b and a portion of the dummy portion 223bp of the third opposite electrode 223b, which are adjacent to the end of the tip 217T of the first conductive layer 217, may not be removed.

Thereafter, the fifth photoresist 255 is removed.

In some embodiments, areas in which the second photoresist 252, the fourth photoresist 254, and the fifth photoresist 255 are formed may partially overlap each other. In such an embodiment, some of the dummy portion 222*rp* of the first emission layer 222*r*, the dummy portion 223*rp* of the first opposite electrode 223*r*, the dummy portion 222*gp* of the second emission layer 222*g*, the dummy portion 223*gp* of the second opposite electrode 223*g*, the dummy portion 222*bp* of the third emission layer 222*b*, and the dummy portion 223*bp* of the third opposite electrode 223*b* may overlap each other between tips 217T of adjacent first conductive layers 217.

Because the first organic light-emitting diode OLED1 is sealed by the first inorganic encapsulation layer 311, a series of processes for forming the second organic light-emitting diode OLED2, the second inorganic encapsulation layer 312, the third organic light-emitting diode OLED3, and the third inorganic encapsulation layer 313 may be performed without damaging the first organic light-emitting diode OLED1. Similarly, because the second organic light-emitting diode OLED2 is sealed by the second inorganic encapsulation layer 312, a series of processes for forming the third organic light-emitting diode OLED3 and the third inorganic encapsulation layer 313 may be performed without damaging the second organic light-emitting diode OLED2.

Also, the first emission layer 222*r* of the first organic light-emitting diode OLED1, the second emission layer 222*g* of the second organic light-emitting diode OLED2, and the third emission layer 222*b* of the third organic light-emitting diode OLED3 may be formed without a separate mask. Therefore, an area of the display area DA may be improved by reducing a dead space area by omitting a spacer and/or an outer dam for supporting the mask.

Figure 24:
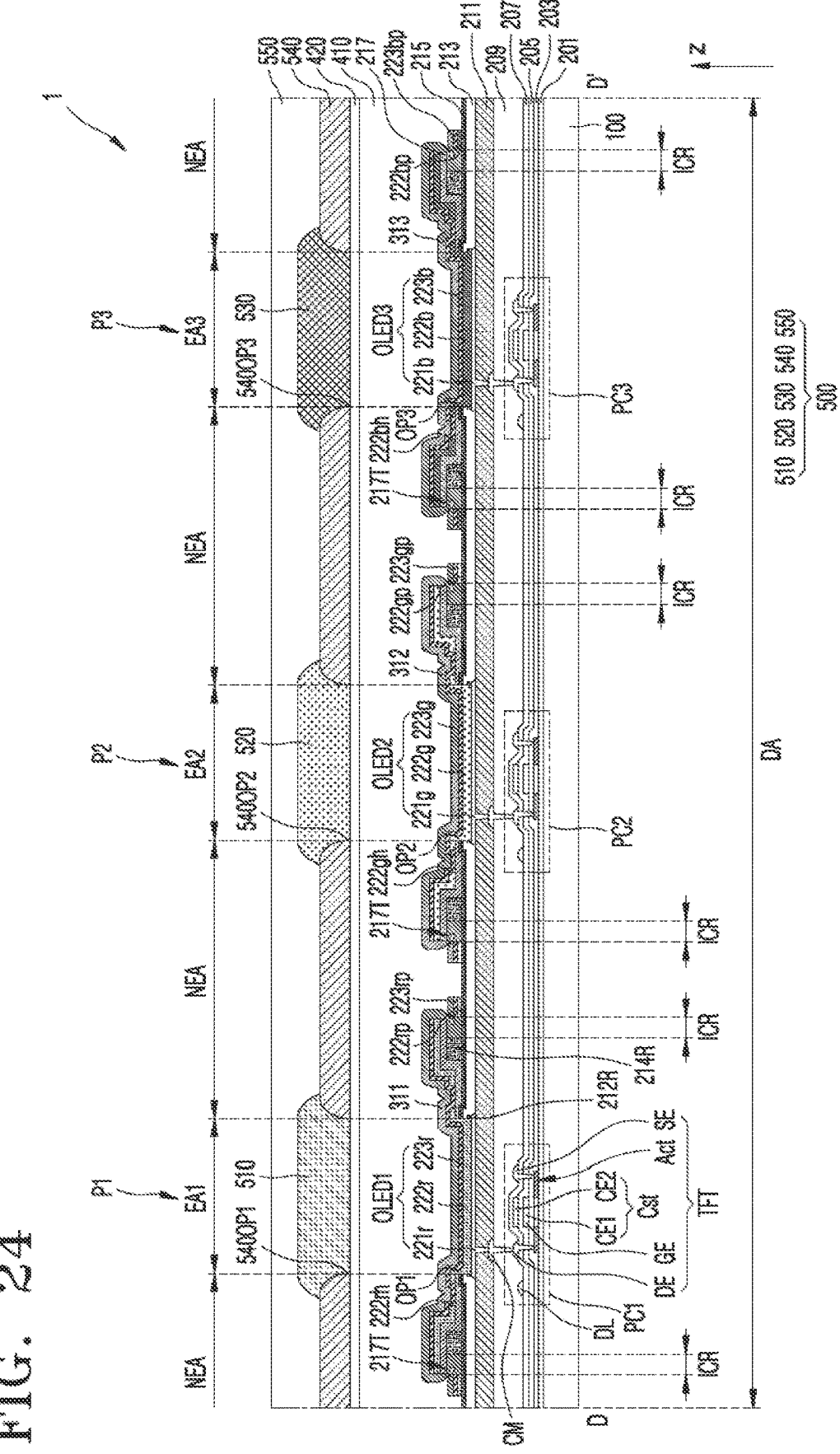

Referring to FIG. 24, the organic planarization layer 410 may be formed to cover the structure described with reference to FIG. 23. The organic planarization layer 410 may provide a flat base surface by covering (or filling) unevenness generated by the pixel-defining layer 213, the bank layer 215, and the first conductive layer 217. The organic planarization layer 410 may be formed by applying and curing a monomer.

In an embodiment, the organic planarization layer 410 may be formed to have a refractive index greater than refractive indices of the first inorganic encapsulation layer 311, the second inorganic encapsulation layer 312, and the third inorganic encapsulation layer 313. For example, the refractive index of the organic planarization layer 410 may be in a range of about 1.6 to about 1.9. The organic planarization layer 410 may further include dispersed particles to achieve a high refractive index.

The protective layer 420 may be formed on the organic planarization layer 410. The protective layer 420 may be formed by depositing an inorganic insulating material, such as SiN$_x$, SiON, and SiO$_x$.

The anti-reflection layer 500 may be formed over the protective layer 420, the anti-reflection layer 500 including the first color filter 510, the second color filter 520, the third color filter 530, the light-shielding layer 540, and the overcoat layer 550.

The light-shielding layer 540 may be formed on the protective layer 420 and may have the first filter opening 540OP1 corresponding to the first emission area EA1, the second filter opening 540OP2 corresponding to the second emission area EA2, and the third filter opening 540OP3 corresponding to the third emission area EA3. The light-shielding layer 540 may include a black matrix.

The first color filter 510 may be formed in the first filter opening 540OP1, the second color filter 520 may be formed in the second filter opening 540OP2, and the third color filter 530 may be formed in the third filter opening 540OP3.

The overcoat layer 550 may be formed on the first to third color filters 510, 520, and 530 and the light-shielding layer 540. The overcoat layer 550 may be formed by applying a colorless light-transmissive organic material, such as an acrylic resin. The overcoat layer 550 may provide a flat upper surface by covering (or filling) unevenness generated by the first to third color filters 510, 520, and 530 and the light-shielding layer 540.

In some embodiments, the light-shielding layer 540 may be omitted, and the first color filter 510, the second color filter 520, and the third color filter 530 may be formed to overlap each other in the non-emission area NEA. For example, the first color filter 510 covers the display area DA of the substrate 100 and may have openings respectively overlapping the second emission area EA2 and the third emission area EA3. The second color filter 520 may cover the display area DA of the substrate 100 and may have openings respectively overlapping the first emission area EA1 and the third emission area EA3. The third color filter 530 may cover the display area DA of the substrate 100 and may have openings respectively overlapping the first emission area EA1 and second emission area EA2.

The anti-reflection layer 500 may block or reduce reflection of light (e.g., external light) incident from the outside toward the display apparatus 1 by the bank layer 215 and the first conductive layer 217.

Figure 25:
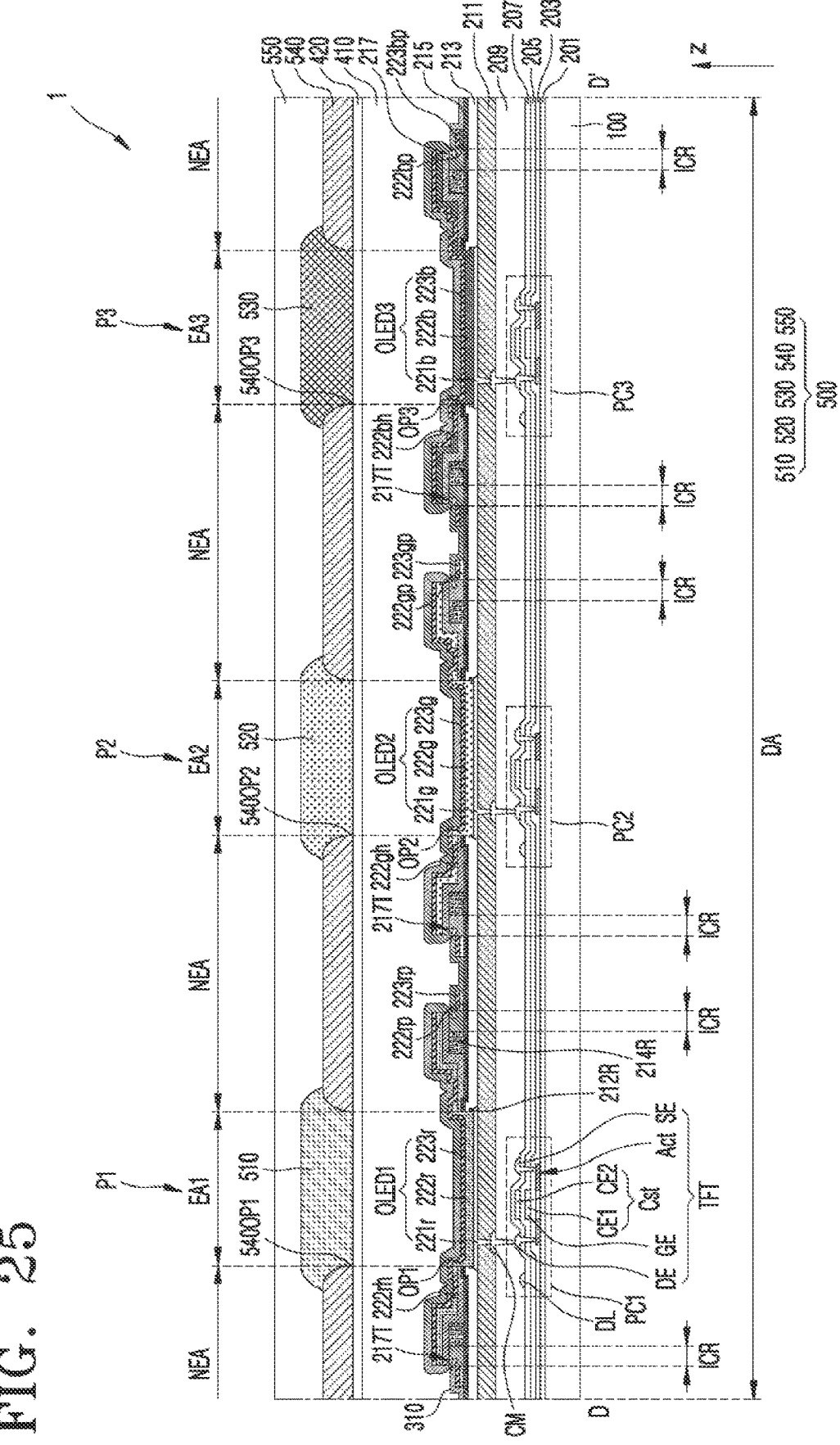
FIG. 25 is a schematic cross-sectional view of a display apparatus according to an embodiment.

FIG. 25 is a cross-sectional view of the display apparatus 1 according to an embodiment. Although the display apparatus 1 of FIG. 25 is similar to the display apparatus 1 described with reference to FIG. 24, an inorganic encapsulation layer 310 that seals the first organic light-emitting diode OLED1, the second organic light-emitting diode OLED2, and the third organic light-emitting diode OLED3 is integrally provided as a single body in the display apparatus 1 of FIG. 25.

Referring to FIG. 25, the inorganic encapsulation layer 310 may be disposed on the first opposite electrode 223*r*, the second opposite electrode 223*g*, and the third opposite electrode 223*b*. The inorganic encapsulation layer 310 may be formed over the front surface of the substrate 100. The inorganic encapsulation layer 310 has a relatively excellent step coverage and, thus, may cover at least a portion of the exposed lower surface of the tip 217T of the first conductive layer 217. The inorganic encapsulation layer 310 may be in direct contact with a metal surface on the side and lower surfaces of the tip 217T of the first conductive layer 217 to form the inorganic contact region ICR. Accordingly, the inorganic contact region ICR forms a closed loop entirely surrounding each of the first organic light-emitting diode OLED1, the second organic light-emitting diode OLED2, and the third organic light-emitting diode OLED3, and thus, a path through which impurities, such as moisture and/or air, penetrate may be reduced or blocked.

Although FIG. 25 illustrates an embodiment in which the first emission layer 222*r*, the second emission layer 222*g*, and the third emission layer 222*b*, which emit light of different colors, are arranged to correspond to the first pixel electrode 221*r*, the second pixel electrode 221*g*, and the third pixel electrode 221*b*, one or more embodiments are not limited thereto.

In some embodiments, emission layers emitting the same color may also be disposed on the first pixel electrode 221*r*, the second pixel electrode 221*g*, and the third pixel electrode 221*b*. For example, the first organic light-emitting diode OLED1, the second organic light-emitting diode OLED2, and the third organic light-emitting diode OLED3 may emit light of a third color, and light conversion layers may be arranged over at least some of the first organic light-emitting diode OLED1, the second organic light-emitting diode OLED2, and the third organic light-emitting diode OLED3, respectively. In such an embodiment, an emission layer may be formed over the front surface of the substrate 100. Dummy portions of the emission layers positioned in the non-emission area NEA between adjacent pixels may be integrally provided as a single body without being spaced apart from each other. Similarly, in some embodiments, an opposite electrode may be formed over the front surface of the substrate 100. Dummy portions of opposite electrodes positioned in the non-emission area NEA between adjacent pixels may be integrally provided as a single body without being spaced apart from each other.

According to the embodiments described above, a display apparatus has an expanded display area by reducing an area of a dead space, and a method of manufacturing the same, is provided. However, neither the present disclosure nor the embodiments thereof are not limited to the above aspects and features.

It should be understood that the embodiments described herein are to be considered in a descriptive sense and not for purposes of limitation. Descriptions of features or aspects within each of the embodiments should typically be considered as available for other similar features or aspects in other embodiments. While embodiments have been described with reference to the figures, it will be understood by one of ordinary skill in the art that various changes in form and details may be made therein without departing from the spirit and scope as defined by the following claims and their equivalents.

What is claimed is:

1. A display apparatus comprising:
a substrate having a display area and a peripheral area extending around a periphery of the display area;
a pixel electrode in the display area;
a pixel-defining layer on the pixel electrode and having a first sub-opening exposing a central portion of the pixel electrode;
a bank layer on the pixel-defining layer and having a second sub-opening exposing the central portion of the pixel electrode;
a first conductive layer on the bank layer and having a tip protruding outwardly beyond the pixel electrode and the second sub-opening;
an emission layer over the pixel electrode and the first conductive layer and having an opening exposing a portion of an upper surface of the first conductive layer; and
an opposite electrode on the emission layer and in direct contact with the first conductive layer through the opening in the emission layer.

2. The display apparatus of claim 1, wherein the pixel-defining layer comprises an inorganic insulating material, and
wherein the bank layer comprises a metal material.

3. The display apparatus of claim 1, further comprising a common voltage line in the peripheral area and configured to receive a common voltage, wherein the pixel-defining layer and the bank layer extend to the peripheral area to cover the common voltage line,
wherein the pixel-defining layer has an opening exposing a portion of an upper surface of the common voltage line, and
wherein the bank layer is in direct contact with the common voltage line through the opening in the pixel-defining layer.

4. The display apparatus of claim 1, further comprising a low reflection layer covering the first conductive layer,
wherein the low reflection layer comprises a metal oxide.

5. The display apparatus of claim 1, wherein the first conductive layer has an undercut structure.

6. The display apparatus of claim 1, wherein the emission layer and the opposite electrode are disconnected by the tip.

7. The display apparatus of claim 1, further comprising an inorganic encapsulation layer on the opposite electrode,
wherein the inorganic encapsulation layer is in direct contact with a lower surface of the tip.

8. The display apparatus of claim 7, further comprising:
a light-shielding layer on the inorganic encapsulation layer and having a filter opening corresponding to the pixel electrode; and
a color filter on the light-shielding layer and overlapping the pixel electrode.

9. The display apparatus of claim 7, further comprising an organic planarization layer on the inorganic encapsulation layer,
wherein a refractive index of the organic planarization layer is greater than a refractive index of the inorganic encapsulation layer.

10. The display apparatus of claim 9, wherein the refractive index of the organic planarization layer is 1.6 or more.

11. The display apparatus of claim 1, wherein the opening in the emission layer has a loop shape extending around at least a portion of a periphery of the second sub-opening.

12. The display apparatus of claim 1, further comprising a first residual sacrificial layer between the pixel electrode and the pixel-defining layer, the first residual sacrificial layer overlapping an edge of the pixel electrode.

13. The display apparatus of claim 1, further comprising a second residual sacrificial layer between the bank layer and the first conductive layer, the second residual sacrificial layer being under the tip.

14. A method of manufacturing a display apparatus, the method comprising:
forming, on a substrate, a pixel electrode and a first sacrificial layer corresponding to the pixel electrode;
forming a pixel-defining layer and a bank layer to cover the first sacrificial layer;
forming, on the bank layer, a second sacrificial layer extending around a periphery of the pixel electrode;
forming a first conductive layer to cover the bank layer and the second sacrificial layer;
forming a first opening and a tip of the first conductive layer, the first opening exposing a central portion of the pixel electrode by penetrating through the pixel-defining layer, the bank layer, and the first conductive layer, the tip protruding outwardly beyond the pixel electrode;
forming an emission layer having an opening exposing a portion of an upper surface of the first conductive layer; and
forming an opposite electrode layer on the emission layer.

15. The method of claim 14, wherein the emission layer is formed on a front surface of the substrate.

16. The method of claim 14, wherein the opening in the emission layer is formed by a laser drilling process.

17. The method of claim 14, wherein the opening in the emission layer has a loop shape extending around at least a portion of a periphery of the first opening.

18. The method of claim 14, wherein the first conductive layer has an undercut structure, and wherein the emission layer is disconnected by the tip.

19. The method of claim 18, wherein the opposite electrode layer is in direct contact with the first conductive layer through the opening in the emission layer.

20. The method of claim 14, further comprising forming an inorganic encapsulation layer on the opposite electrode layer.

21. The method of claim 20, wherein the inorganic encapsulation layer is formed to be in direct contact with a lower surface of the tip.

22. The method of claim 20, further comprising:

forming, on the inorganic encapsulation layer, a light-shielding layer having a filter opening corresponding to the pixel electrode; and forming, on the light-shielding layer, a color filter overlapping the pixel electrode.

23. The method of claim 20, further comprising forming an organic planarization layer on the inorganic encapsulation layer, wherein a refractive index of the organic planarization layer is greater than a refractive index of the inorganic encapsulation layer.

24. The method of claim 14, wherein the forming of the first conductive layer further comprises forming a low reflection layer on the first conductive layer.

\* \* \* \* \*